(12) United States Patent
Hong et al.

(10) Patent No.: US 12,419,042 B2
(45) Date of Patent: Sep. 16, 2025

(54) INTEGRATED CIRCUIT DEVICE

(71) Applicant: SAMSUNG ELECTRONICS CO., LTD., Suwon-si (KR)

(72) Inventors: Jiseok Hong, Suwon-si (KR); Sangho Lee, Seoul (KR); Seoryong Park, Ansan-si (KR); Jiyoung Ahn, Seoul (KR); Kiseok Lee, Seoul (KR); Kiseok Lee, Hwaseong-si (KR); Yoonyoung Choi, Seoul (KR); Seunguk Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 373 days.

(21) Appl. No.: 18/186,593

(22) Filed: Mar. 20, 2023

(65) Prior Publication Data

US 2023/0232616 A1  Jul. 20, 2023

Related U.S. Application Data

(63) Continuation of application No. 17/168,952, filed on Feb. 5, 2021, now Pat. No. 11,647,627.

(30) Foreign Application Priority Data

Jun. 23, 2020 (KR) .................... 10-2022-0076763

(51) Int. Cl.
*H10B 12/00* (2023.01)
(52) U.S. Cl.
CPC ....... *H10B 12/485* (2023.02); *H10B 12/0335* (2023.02); *H10B 12/315* (2023.02); *H10B 12/482* (2023.02)

(58) Field of Classification Search
CPC ......... H01L 27/10814; H01L 27/10855; H01L 27/10885; H01L 27/10888; H10B 12/315; H10B 12/482; H10B 12/485
See application file for complete search history.

(56) References Cited

U.S. PATENT DOCUMENTS

| 8,643,087 B2 | 2/2014 | Sandhu et al. |
| 8,969,936 B2 | 3/2015 | Lee et al. |

(Continued)

FOREIGN PATENT DOCUMENTS

| KR | 10-2004-0050799 A | 6/2004 |
| KR | 10-2014-0052225 A | 5/2014 |

(Continued)

OTHER PUBLICATIONS

Communication issued Jun. 19, 2024 by the Korean Patent Office for KR Patent Application No. 10-2020-0076763.

(Continued)

*Primary Examiner* — Steven M Page
(74) *Attorney, Agent, or Firm* — Sughrue Mion, PLLC

(57) ABSTRACT

An integrated circuit device includes: a substrate including a plurality of active regions; a bit line extending on the substrate in a horizontal direction; a direct contact connected between a first active region selected among the plurality of active regions and the bit line; an inner oxide layer contacting a sidewall of the direct contact; and a carbon-containing oxide layer nonlinearly extending on a sidewall of the bit line in a vertical direction, the carbon-containing oxide layer contacting the sidewall of the bit line.

20 Claims, 35 Drawing Sheets

(56) References Cited

U.S. PATENT DOCUMENTS

| | | | |
|---|---|---|---|
| 9,177,891 B2 | 11/2015 | Kim et al. | |
| 9,721,964 B2 | 8/2017 | Lee | |
| 10,157,841 B2* | 12/2018 | Borsari | H10B 12/315 |
| 10,461,153 B2 | 10/2019 | Lee et al. | |
| 10,522,548 B2 | 12/2019 | Chun | |
| 10,573,652 B2* | 2/2020 | Lee | H10B 12/315 |
| 10,847,519 B2* | 11/2020 | Ji | H01L 21/02126 |
| 2015/0187644 A1 | 7/2015 | Kim | |
| 2017/0278848 A1 | 9/2017 | Wu | |
| 2018/0175040 A1* | 6/2018 | Kim | H01L 21/76224 |
| 2019/0096890 A1* | 3/2019 | Lee | H10B 12/485 |
| 2019/0296024 A1 | 9/2019 | Ji et al. | |

FOREIGN PATENT DOCUMENTS

| | | | |
|---|---|---|---|
| KR | 10-2019-0035250 A | 4/2019 | |
| KR | 10-2019-0112444 A | 10/2019 | |
| TW | 201546966 A | 12/2015 | |

OTHER PUBLICATIONS

Communication issued Jan. 24, 2022 by the Taiwanese Intellectual Property Office in Taiwanese Patent Application No. 110112152.

\* cited by examiner

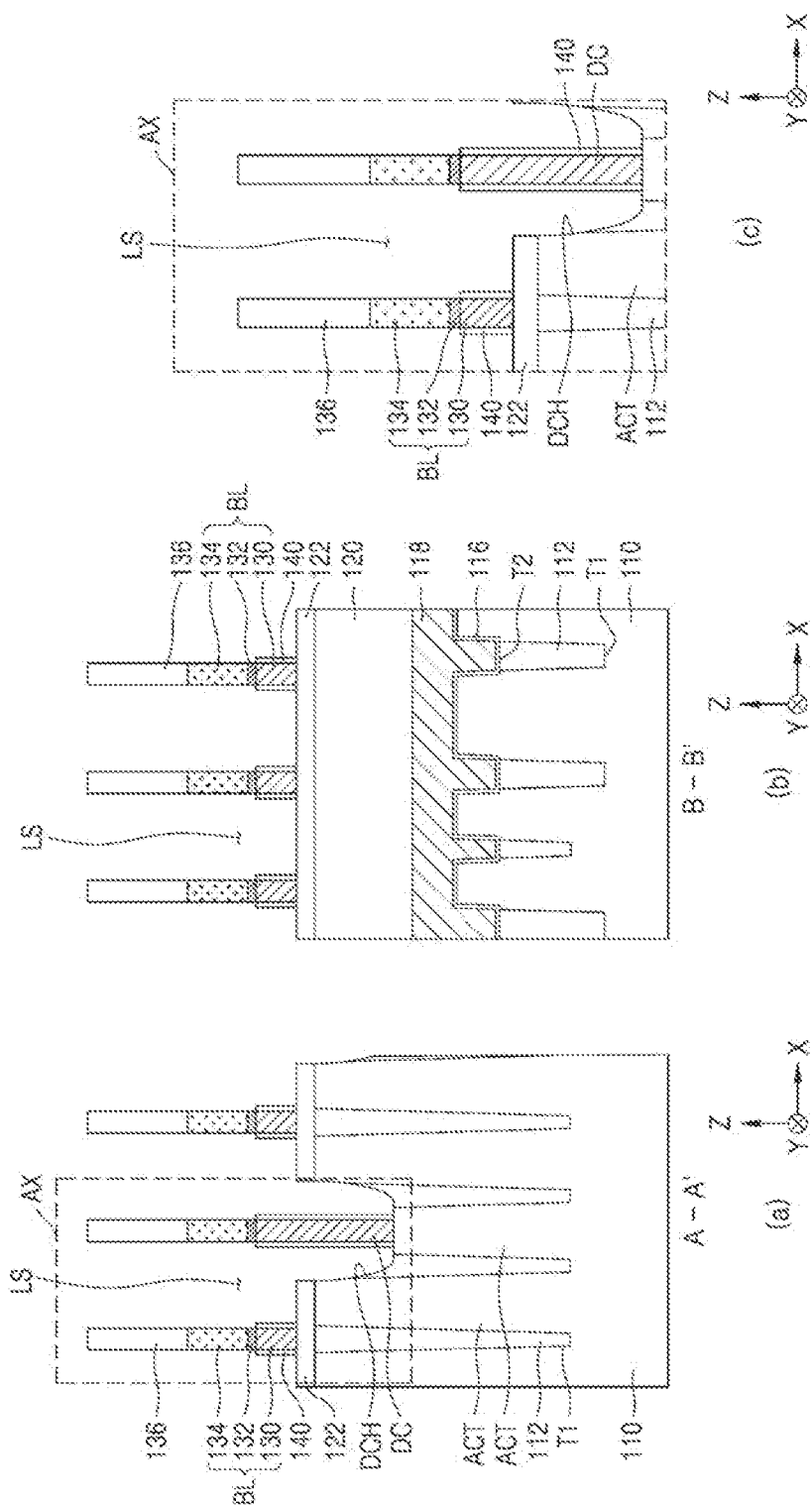

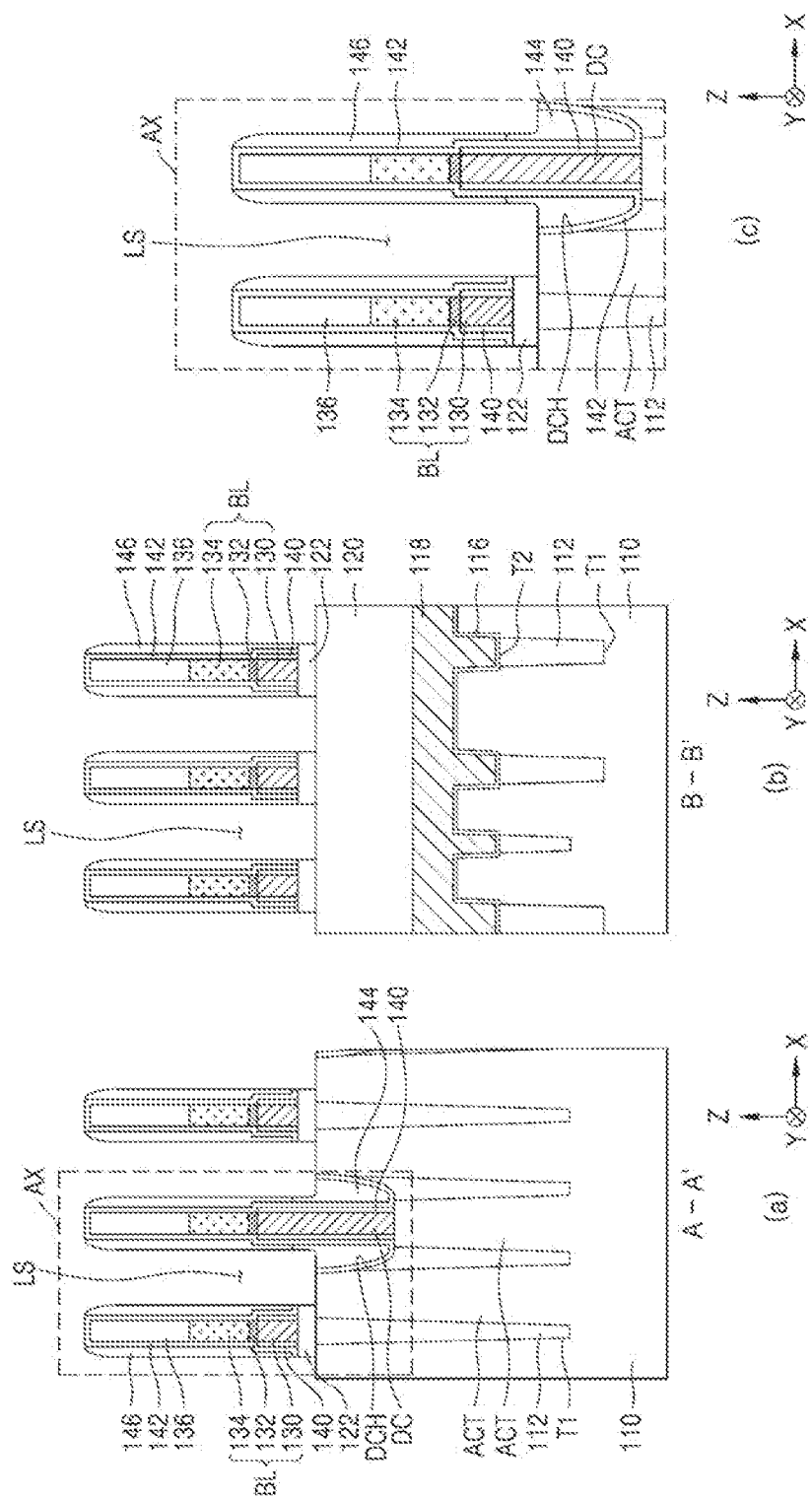

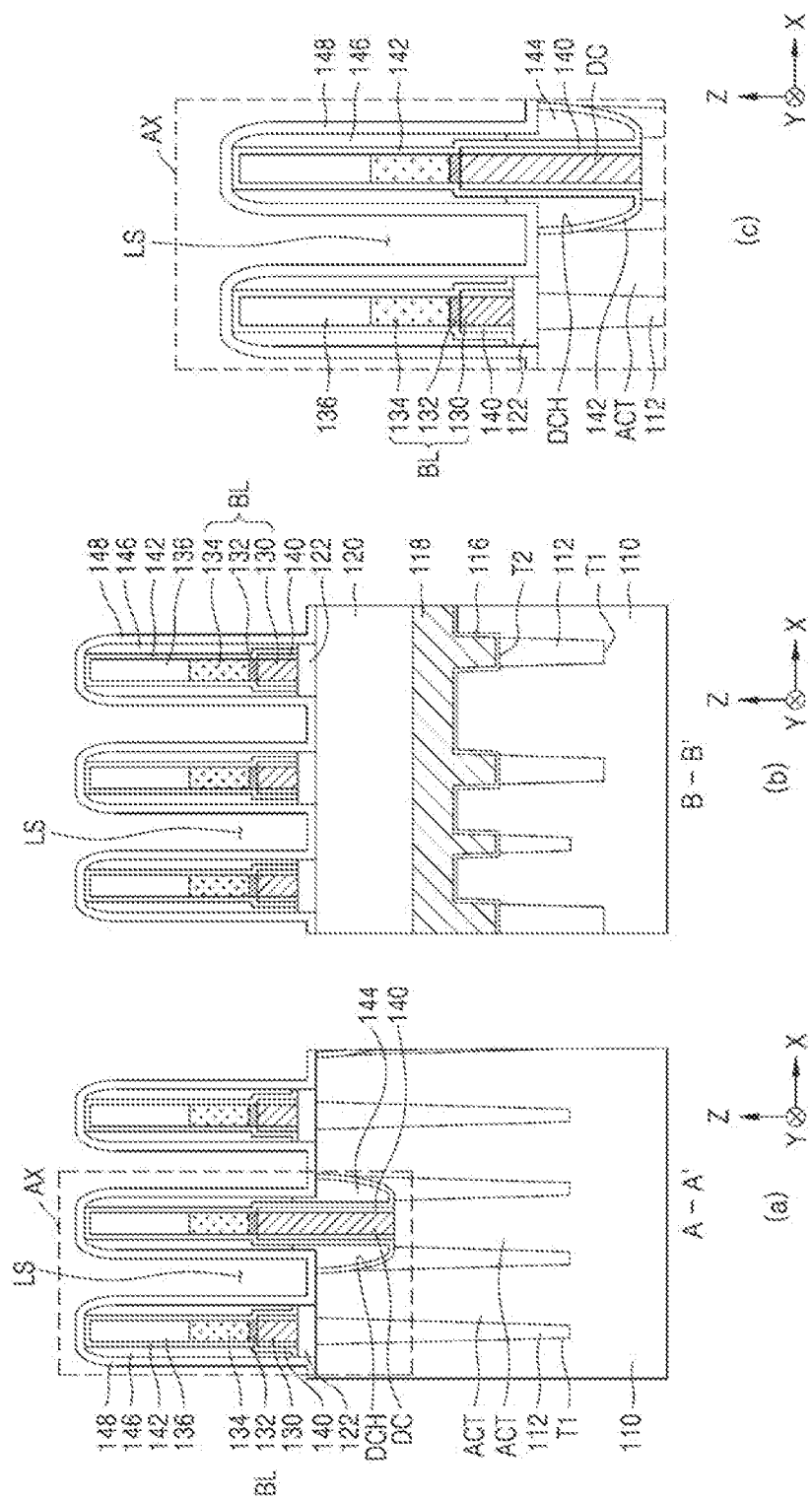

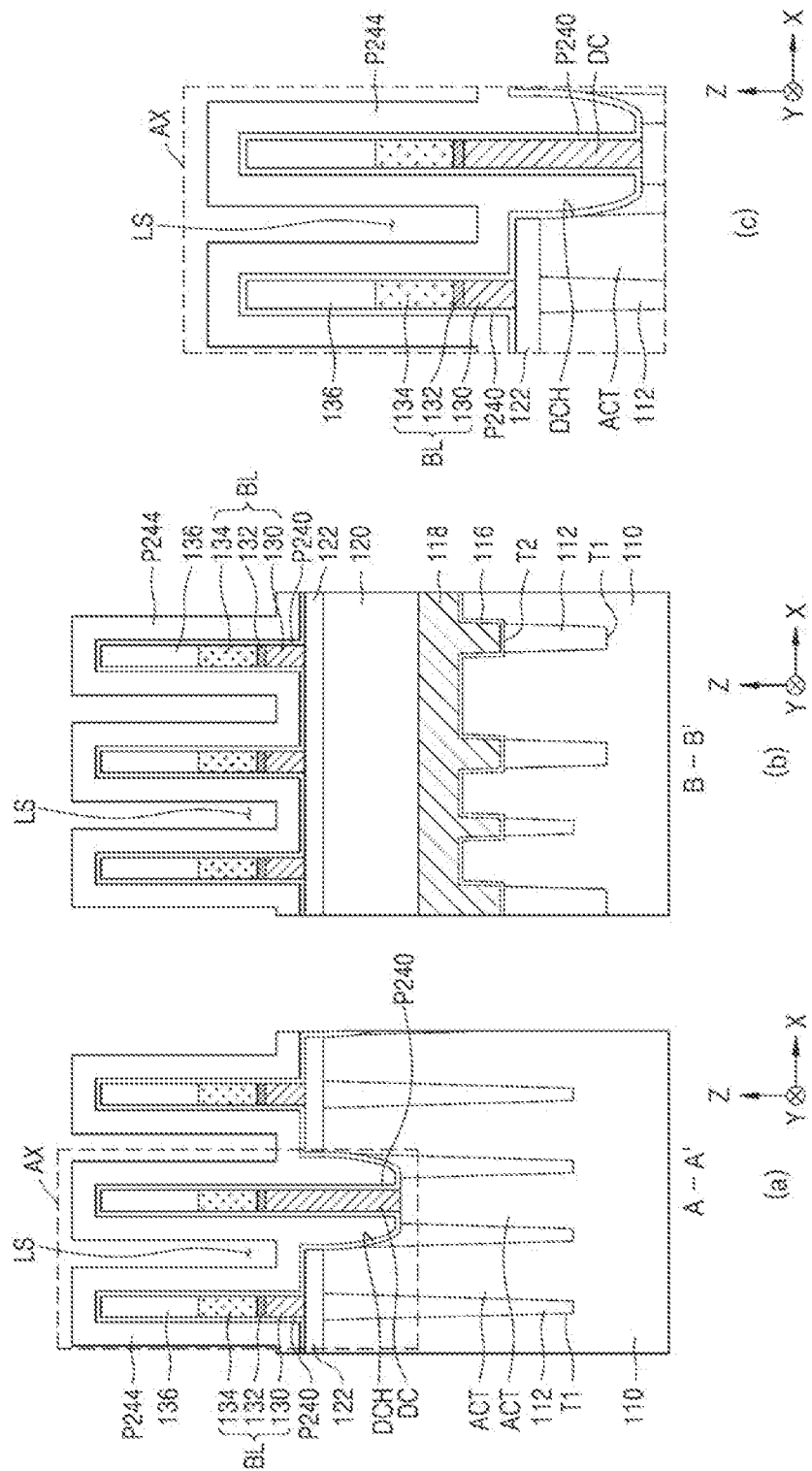

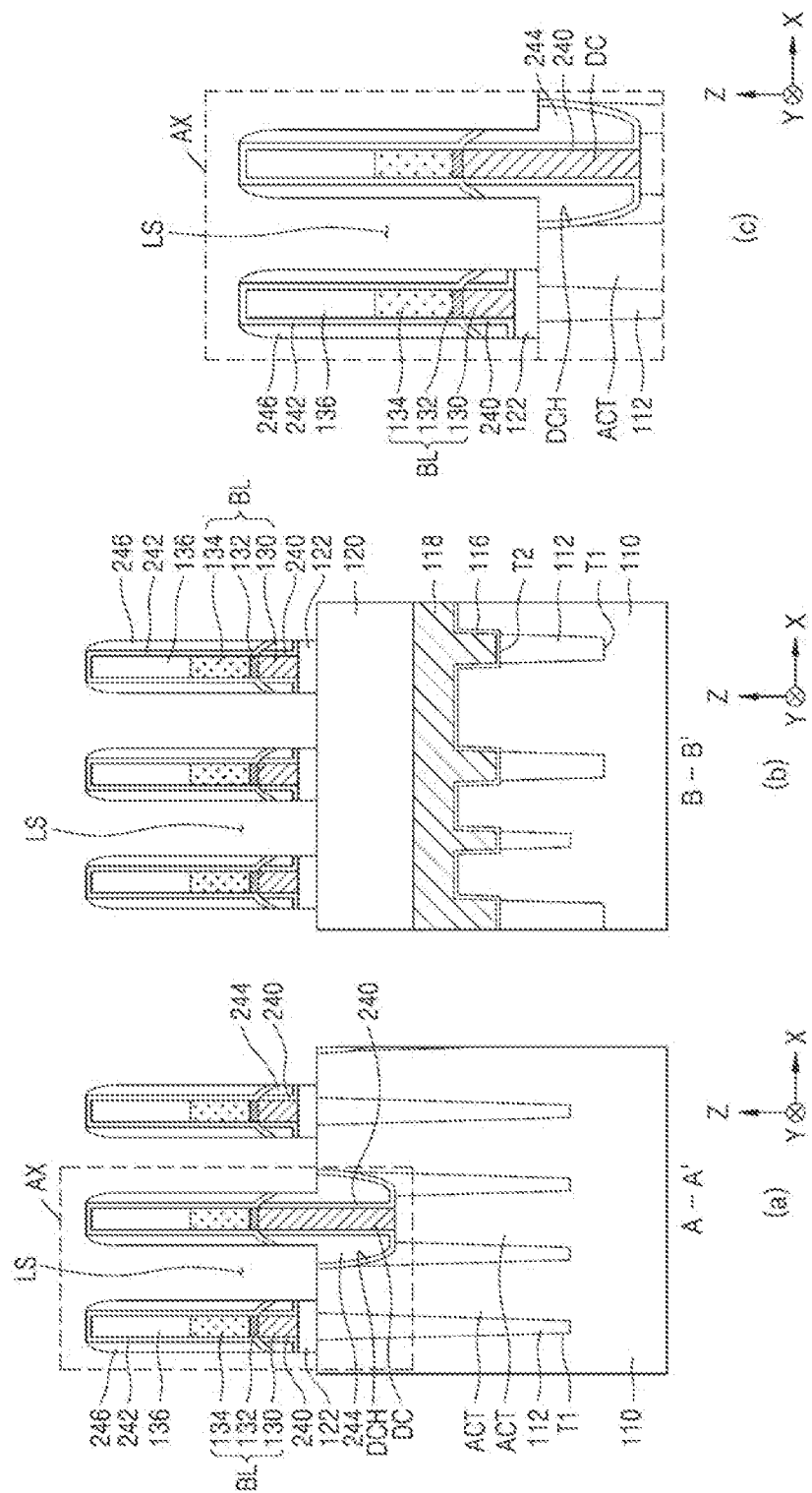

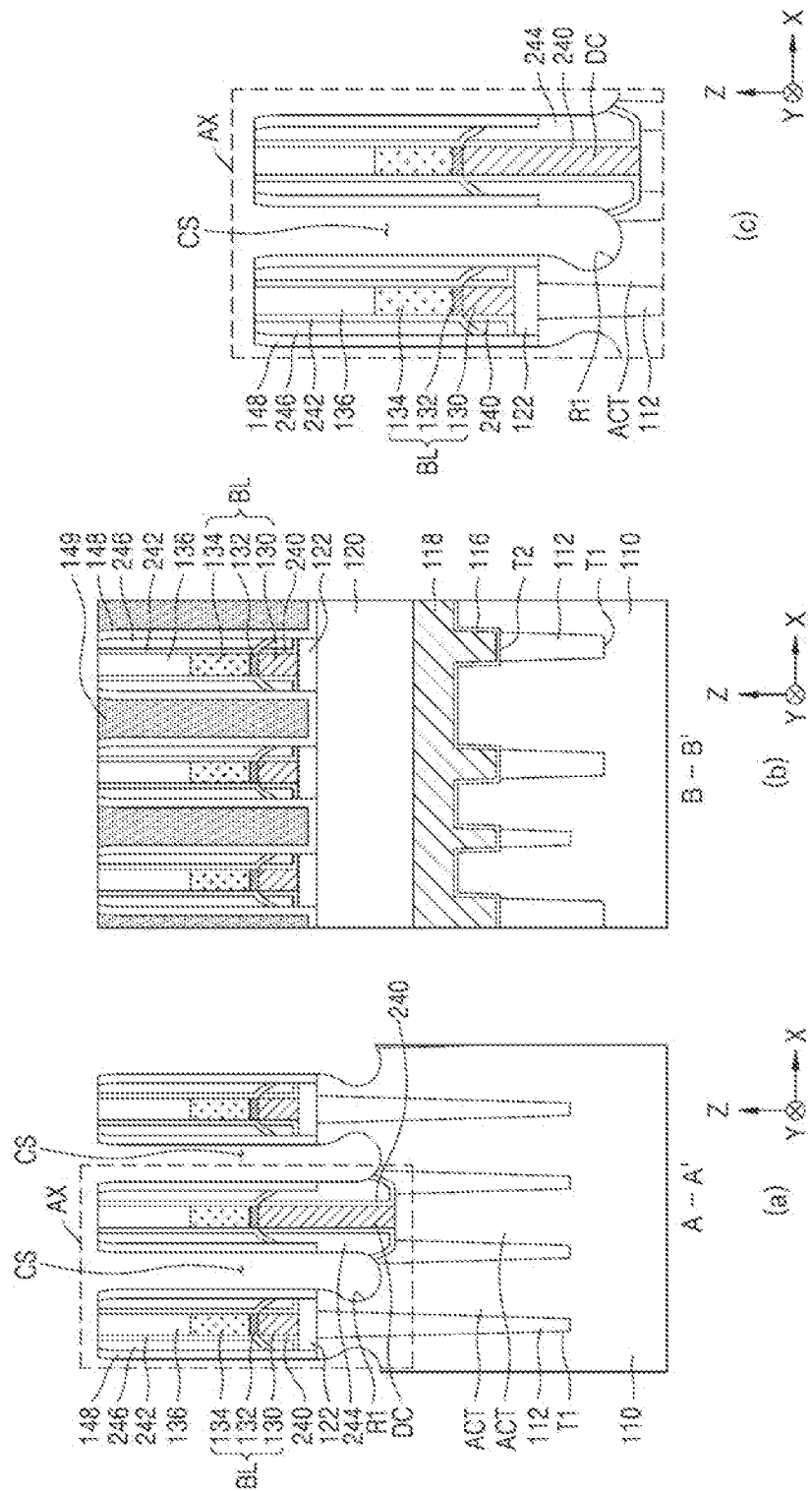

FIG. 12G

INTEGRATED CIRCUIT DEVICE

CROSS-REFERENCE TO THE RELATED APPLICATION

This application is a Continuation of U.S. patent application Ser. No. 17/168,952, filed on Feb. 5, 2021, which is based on and claims priority under 35 U.S.C. § 119 to Korean Patent Application No. 10-2020-0076763, filed on Jun. 23, 2020, in the Korean Intellectual Property Office, the disclosure of which is incorporated by reference herein in its entirety.

BACKGROUND

The inventive concept relates to an integrated circuit device, and more particularly, to an integrated circuit device including a plurality of conductive lines.

Recently, as down-scaling of integrated circuit devices has progressed rapidly, spaces between each of a plurality of conductive lines are reduced, and accordingly, separation distances between the plurality of conductive lines and between each of the plurality of conductive regions have gradually decreased. Accordingly, there is a need to develop a technology for implementing an integrated circuit device capable of suppressing parasitic capacitance between the plurality of conductive lines and other conductive regions adjacent thereto and maintaining a structure in which the plurality of conductive lines are stable and reliable.

SUMMARY

An aspect of the inventive concept is to provide an integrated circuit device capable of suppressing parasitic capacitance between a conductive line and another conductive line adjacent thereto even when an area of a device region is reduced according to down-scaling of a semiconductor device, and maintaining a structure in which the conductive line is stable and reliable.

According to an aspect of the disclosure, there is provided an integrated circuit device comprising: a substrate comprising a plurality of active regions; a bit line extending on the substrate in a first direction; a direct contact connected between a first active region among the plurality of active regions and the bit line; an inner oxide layer contacting a sidewall of the direct contact; and a carbon-containing oxide layer extending on a sidewall of the bit line in a second direction perpendicular to the first direction, the carbon-containing oxide layer contacting the sidewall of the bit line.

According to another aspect of the disclosure, there is provided an integrated circuit device comprising: a substrate comprising a plurality of active regions; a plurality of bit lines spaced apart from each other on the substrate in a first direction, the plurality of bit lines extending in a second direction crossing the first direction; a direct contact connected provided between a first active region among the plurality of active regions and a first bit line among the plurality of bit lines; a contact plug connected to a second active region adjacent to the first active region among the plurality of active regions, the contact plug extending on the substrate in a third direction perpendicular to the first direction and the second direction; and a spacer structure provided between the first bit line and the contact plug, wherein the spacer structure comprises: an inner oxide layer contacting a sidewall of the direct contact; and a carbon-containing oxide layer extending on a sidewall of the first bit line in the third direction, the carbon-containing oxide layer being in direct contact with a sidewall of the first bit line.

According to another aspect of the disclosure, there is provided an integrated circuit device comprising: a substrate comprising a plurality of active regions spaced apart from each other; a first bit line and a second bit line spaced apart from each other on the substrate in a first direction, the first bit line and the second bit line extending in a second direction crossing the first direction; a plurality of contact plugs arranged in a row between the first bit line and the second bit line in the second direction; a plurality of insulating fences provided respectively between the plurality of contact plugs; a direct contact connected between a first active region among the plurality of active regions and the first bit line; and a spacer structure provided between the first bit line and the contact plug, wherein the spacer structure comprises: an inner oxide layer contacting a sidewall of the direct contact, the inner oxide layer comprising a silicon oxide layer; and an SiOC layer extending on a sidewall of the first bit line in a third direction, the SiOC layer contacting the sidewall of the first bit line.

According to another aspect of the disclosure, there is provided an integrated circuit device comprising: a substrate comprising a plurality of active regions; a bit line extending on the substrate in a first direction, the bit line comprising a lower conductive layer, an intermediate conductive layer, and an upper conductive layer sequentially stacked on the substrate; the lower conductive layer including a doped polysilicon layer; an inner oxide layer contacting a first portion of a sidewall of the bit line at the lower conductive layer; and a carbon-containing oxide layer contacting a second portion of the sidewall above the first portion of the sidewall.

According to another aspect of the disclosure, there is provided an integrated circuit device comprising: a substrate comprising a plurality of active regions; a bit line extending on the substrate in a first direction; a direct contact having a lower surface contacting a first active region among the plurality of active regions and an upper surface contacting the bit line, the direct contact including a doped polysilicon layer; an inner oxide layer contacting a sidewall of the direct contact at a lower portion of the direct contact; and a carbon-containing oxide layer contacting the sidewall of the direct contact at an upper portion of the direct contact and contacting the sidewall of the bit line.

BRIEF DESCRIPTION OF THE DRAWINGS

Embodiments of the inventive concept will be more clearly understood from the following detailed description taken in conjunction with the accompanying drawings in which:

FIGS. 12A through 12H are cross-sectional views illustrating a manufacturing method of an integrated circuit device according to process sequences, according to another example embodiments of the inventive concept.

DETAILED DESCRIPTION OF THE EMBODIMENTS

Figure 1:
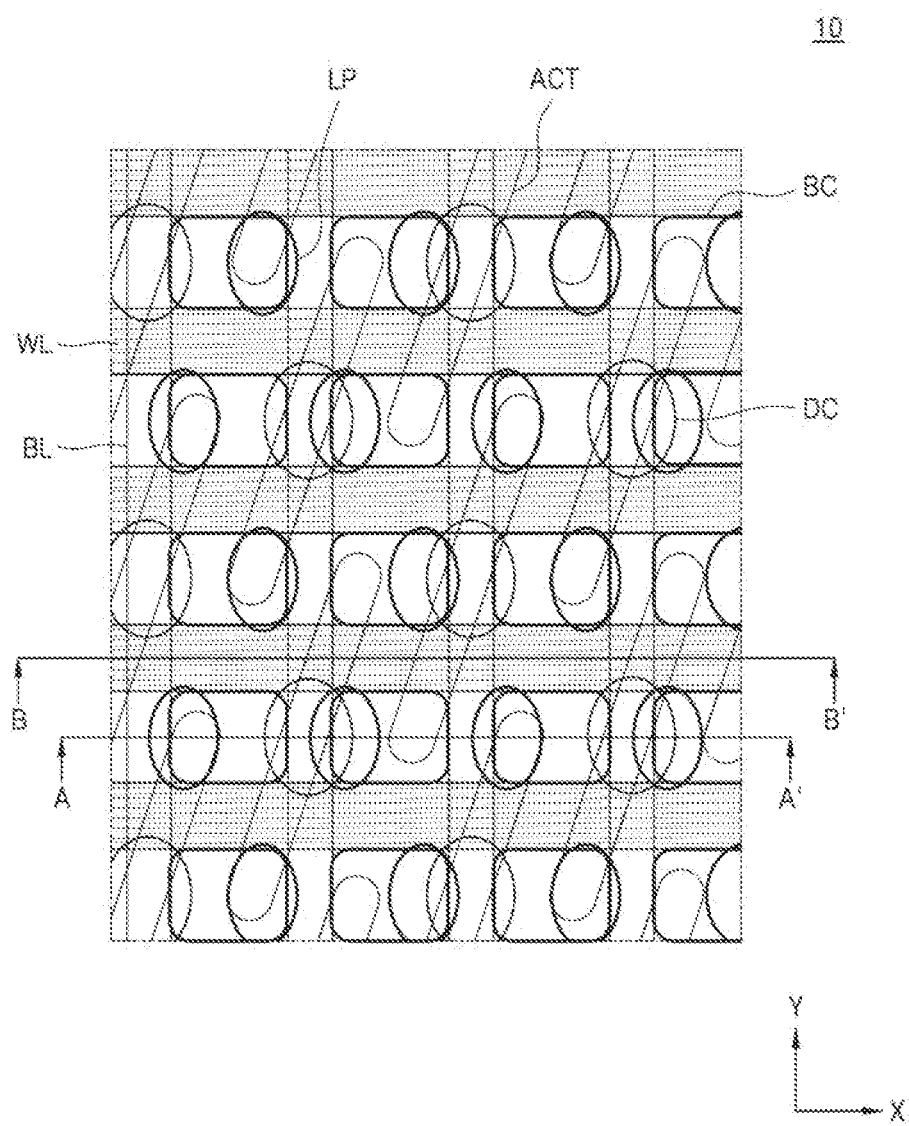
FIG. 1 is a schematic planar layout of main components of a memory cell array region of an integrated circuit device, according to an example embodiment of the inventive concept.

Hereinafter, example embodiments of the inventive concept will be described in detail with reference to the accompanying drawings. Identical reference numerals are used for the same constituent devices in the drawings, and a duplicate description thereof will be omitted.

FIG. 1 is a schematic planar layout of a memory cell array area of an integrated circuit device 10, according to an example embodiment of the inventive concept.

Referring to FIG. 1, the integrated circuit device 10 may include a plurality of active regions ACT. The plurality of active regions ACT may be arranged in a diagonal direction with respect to a first horizontal direction (X direction) and a second horizontal direction (Y direction).

A plurality of word lines WL may extend in parallel with each other in the first horizontal direction (X direction) across the plurality of active regions ACT. On the plurality of word lines WL, a plurality of bit lines BL may extend in parallel with each other in the second horizontal direction (Y direction) across the first horizontal direction (X direction). The plurality of bit lines BL may be connected to the plurality of active regions ACT via direct contacts DC.

A plurality of buried contacts BC may be between two adjacent bit lines BL among the plurality of bit lines BL. According to an example embodiment, the plurality of buried contacts BC may be arranged in a line in the first horizontal direction (X direction) and the second horizontal direction (Y direction), respectively. A plurality of conductive landing pads LP may be formed on the plurality of buried contacts BC. The plurality of buried contacts BC and the plurality of conductive landing pads LP may connect bottom electrodes of capacitors formed on top portions of the plurality of bit lines BL to the active region ACT. At least a portion of each of the plurality of conductive landing pads LP may vertically overlap the buried contact BC.

Next, example configurations of integrated circuit devices according to embodiments of the inventive concept are described with reference to FIGS. 2 through 10. Each of the integrated circuit devices illustrated in FIGS. 2 through 10 may have a layout of the integrated circuit device 10 illustrated in FIG. 1 according to various example embodiments.

FIGS. 2A-2C are cross-sectional views of an integrated circuit device 100 according to an example embodiment of the inventive concept. FIG. 2A is a cross-sectional view of some components of a portion corresponding to a cross-section taken along line A-A' of FIG. 1, FIG. 2B is a cross-sectional view of some components of a portion corresponding to a cross-section taken along line B-B' of FIG. 1, and FIG. 2C is an enlarged cross-sectional view of a portion corresponding to a dash-lined region AX in FIG. 2A.

Referring to FIGS. 2A-2C, the integrated circuit device 100 may include a substrate 110 in which a plurality of active regions ACT are defined by a device isolation layer 112. The device isolation layer 112 may be in a device isolation trench T1 in the substrate 110.

According to an example embodiment, the substrate 110 may include silicon, for example, monocrystalline silicon, polycrystalline silicon, or amorphous silicon. According to another example embodiment, the substrate 110 may include at least one of Ge, SiGe, SiC, GaAs, InAs, or InP. According to an example embodiment, the substrate 110 may include conductive regions, for example, a well doped with an impurity, or a structure doped with an impurity. The device isolation layer 112 may include an oxide layer, a nitride layer, or a combination thereof.

A plurality of word line trenches T2 extending in the first horizontal direction (X direction) may be in the substrate 110, and a plurality of gate dielectric layers 116, a plurality of word lines 118, and a buried insulating layer 120 may be in the plurality of word line trenches T2. The plurality of word lines 118 may correspond to the plurality of word lines WL illustrated in FIG. 1.

The gate dielectric layer 116 may include at least one of a silicon oxide layer, a silicon nitride layer, a silicon oxynitride layer, an oxide/nitride/oxide (ONO) layer, and a high-k dielectric layer having a higher dielectric constant than the silicon oxide layer. The high-k dielectric layer may include $HfO_2$, $Al_2O_3$, $HfAlO_3$, $Ta_2O_3$, $TiO_2$, or a combination thereof. The plurality of word lines 118 may include Ti, TiN, Ta, TaN, W, WN, TiSiN, WSiN, or a combination thereof. The plurality of buried insulating layers 120 may include a silicon oxide layer, a silicon nitride layer, a silicon oxynitride layer, or a combination thereof.

A buffer layer 122 may be on the substrate 110. The buffer layer 122 may cover top surfaces of the plurality of active regions ACT, a top surface of the device isolation layer 112, and top surfaces of the plurality of buried insulating layers 120. According to an example embodiment, the buffer layer 122 may include a first silicon oxide layer, a silicon nitride layer, and a second silicon oxide layer sequentially formed on the substrate 110. However, the disclosure is not limited thereto, and the buffer layer 122 may include a different arrangement.

A plurality of bit lines BL extending parallel to each other in the second horizontal direction (Y direction) may be on the buffer layer 122. The plurality of bit lines BL may be apart from each other in the first horizontal direction (X direction). A direct contact DC may be on a portion of each of the plurality of active regions ACT. Each of the plurality of bit lines BL may be connected to the active region ACT via the direct contact DC. The direct contact DC may include Si, Ge, W, WN, Co, Ni, Al, Mo, Ru, Ti, TiN, Ta, TaN, Cu, or a combination thereof. According to an example embodiment, the direct contact DC may include a doped polysilicon layer. According to an example embodiment, a plurality of recess spaces R1 that expose the active region ACT of the substrate 110 between each of the plurality of bit lines BL may be formed.

Each of the plurality of bit lines BL may include a lower conductive layer 130, an intermediate conductive layer 132, and an upper conductive layer 134 sequentially stacked on the substrate 110. Each of the plurality of bit lines BL may be covered by an insulating capping pattern 136. In a vertical direction (Z direction), the insulating capping pattern 136 may be on the upper conductive layer 134. A top surface of the lower conductive layer 130 of the bit line BL and a top surface of the direct contact DC may be on the same plane. In FIGS. 2A-2C, it is illustrated that the plurality of bit lines BL have a triple conductive layer structure including the lower conductive layer 130, the intermediate conductive layer 132, and the upper conductive layer 134, but the inventive concept is not limited thereto. For example, according to another example embodiment, the plurality of bit lines BL may have a single conductive layer, a double conductive layer, or a stack structure of a plurality of conductive layers of four or more conductive layers.

According to an example embodiment, the bottom conductive layer 130 may include a doped polysilicon layer. Each of the intermediate conductive layer 132 and the upper conductive layer 134 may include a layer including Ti, TiN, TiSiN, tungsten (W), WN, tungsten silicide (WSix), tungsten silicon nitride (WSixNy), ruthenium (Ru), or combination thereof. For example, the intermediate conductive layer 132 may include a TiN layer and/or a TiSiN layer, and the upper conductive layer 134 may include a layer including Ti, TiN, W, WN, WSixNy, Ru, or a combination thereof. The insulating capping pattern 136 may include a silicon nitride layer.

A plurality of contact plugs 150 may be on the substrate 110. The plurality of contact plugs 150 may have a pillar shape extending in the vertical direction (Z direction) in a space between each of the plurality of bit lines BL. Each of the plurality of contact plugs 150 may contact the active region ACT. The lower end of each of the plurality of contact plugs 150 may be at a level lower than the top surface of the substrate 110 so that the lower edge of each of the plurality of contact plugs 150 is buried in the substrate 110. The plurality of contact plugs 150 may include a semiconductor material doped with impurities, a metal, a conductive metal nitride, or a combination thereof, but is not limited thereto.

In the integrated circuit device 100, one direct contact DC and a pair of contact plugs 150 facing each other with the one direct contact DC therebetween may be connected to different active regions AC among the plurality of active regions AC.

The plurality of contact plugs 150 may be arranged in a row in the second horizontal direction (Y direction) between a pair of bit lines BL adjacent to each other selected from the plurality of bit lines BL. An insulating fence 149 may be between each of the plurality of contact plugs 150 arranged in a row in the second horizontal direction (Y direction). The plurality of contact plugs 150 may be insulated from each other by a plurality of insulating fences 149. Each of the plurality of insulating fences 149 may have a pillar shape extending in the vertical direction (Z direction) on the substrate 110. According to an example embodiment, the plurality of insulating fences 149 may include a silicon nitride layer.

The integrated circuit device 100 may include a plurality of spacer structures SP1 between the plurality of bit lines BL and the plurality of contact plugs 150. One spacer structure SP1 may be between one bit line BL and the plurality of contact plugs 150 arranged in a row in the second horizontal direction (Y direction). Each of the plurality of spacer structures SP1 may include an inner oxide layer 140, a carbon-containing oxide layer 142, a gap fill insulating pattern 144, an intermediate insulating spacer 146, and an outer insulating spacer 148.

The inner oxide layers 140 may respectively contact a sidewall of the direct contact DC and a sidewall of the lower conductive layer 130 of the bit line BL. According to an example embodiment, the inner oxide layers 140 may directly contact the sidewall of the direct contact DC and the sidewall of the lower conductive layer 130 of the bit line BL. According to an example embodiment, the inner oxide layer 140 may be apart from the contact plug 150 with the carbon-containing oxide layer 142 therebetween. The inner oxide layer 140 may not include a portion contacting the contact plug 150.

In the vertical direction (Z direction), the uppermost surface of the inner oxide layer 140 may be at the same level as the uppermost surface of the lower conductive layer 130 of the bit line BL and the uppermost surface of the direct contact DC. Both sidewalls of the lower conductive layer 130 of the bit line BL may be covered with the inner oxide layer 140 from the lowermost level to the uppermost level in the vertical direction (Z direction). In addition, both sidewalls of the direct contact DC may be covered with the inner oxide layer 140 from the lowermost level to the uppermost level in the vertical direction (Z direction).

The inner oxide layer 140 may include a silicon oxide layer. For example, when each of the lower conductive layer 130 of the bit line BL and the direct contact DC includes a doped polysilicon layer and each of the lower conductive layer 130 and the direct contact DC contact a silicon nitride layer instead of the silicon oxide layer, a depletion region near interfaces of the silicon nitride layer between the lower conductive layer 130 and the direct contact DC may be formed, and thus, electrical characteristics of the direct contact DC and the lower conductive layer 130 may de deteriorated. According to a technical aspect of the inventive concept, when the lower conductive layer 130 includes a doped polysilicon layer, by forming the inner oxide layers respectively contacting the sidewall of the lower conductive layer 130 with a silicon oxide layer, formation of the depletion region in the lower conductive layer 130 near the interface between the lower conductive layer 130 and the inner oxide layer 140 may be prevented. Similarly, when the direct contact DC includes a doped polysilicon layer, by forming the inner oxide layers respectively contacting the sidewall of the direct contact DC with a silicon oxide layer, formation of the depletion region in the direct contact DC near the interface between the direct contact DC and the inner oxide layer 140 may be prevented. Accordingly, deterioration of the electrical characteristics of the lower conductive layer 130 and the direct contact DC may be prevented.

The carbon-containing oxide layer 142 may contact sidewalls of the intermediate conductive layer 132 and the upper conductive layer 134 of the bit line BL, and a sidewall of the insulating capping pattern 136. The carbon-containing oxide layer 142 may nonlinearly extend on the sidewall of the bit line BL in the vertical direction (Z direction).

The carbon-containing oxide layer 142 may include at least one protrusion 142PR. The at least one protrusion 142PR may have a shape protruding outward from the bit line BL, which is adjacent thereto. In other words, the protrusion 142PR of the carbon-containing oxide layer 142 may have a structure that protrudes in a direction away from the bit line BL adjacent to the carbon-containing oxide layer 142. The at least one protrusion 142PR may include the protrusion 142PR arranged at a level higher than an upper surface of the gap fill insulating pattern 144 in the vertical direction (Z direction).

The carbon-containing oxide layer 142 may include a portion contacting the direct contact DC. In addition, the carbon-containing oxide layer 142 may include a first portion between the bit line BL and the intermediate insulating spacer 146, a second portion contacting the sidewall of the inner oxide layer 140, and a third portion contacting a bottom surface of the intermediate insulating spacer 146. The first portion, the second portion, and the third portion may be integrally connected to each other. The at least one protrusion 142PR may include a protrusion 142PR including the third portion.

The carbon-containing oxide layer 142 may include a material having a lower dielectric constant than that of the silicon oxide layer. According to an example embodiment, the carbon-containing oxide layer 142 may include an SiOC layer. Carbon (C) content in the SiOC layer constituting the carbon-containing oxide layer 142 may be about 10 atomic % to about 50 atomic %. For example, the carbon-containing oxide layer 142 may be expressed as $Si_xO_yC_z$, wherein $0.1 \le x \le 0.5$, $0.1 \le y \le 0.5$, and $0.1 \le z \le 0.8$, but are not limited thereto.

According to an example embodiment, a portion of the carbon-containing oxide layer 142 contacting the bit line BL and the insulating capping pattern 136 may substantially have a constant thickness in the vertical direction (Z direction). In the first horizontal direction (X direction), the carbon-containing oxide layer 142 may have a thickness of about 10 Å (angstrom) to about 30 Å (angstrom).

In the integrated circuit device 100, because the sidewall of the bit line BL is covered by the carbon-containing oxide film 142 having a relatively low dielectric constant, undesired parasitic capacitance between the bit line BL and conductive regions adjacent thereto, for example, the contact plug 150, may be reduced.

The gap fill insulating pattern 144 may be between a lower edge of the contact plug 150 and the direct contact DC, and may cover the lower edge sidewall of the contact plug 150 and the sidewall of the direct contact DC. The sidewall and bottom surface of the gap fill insulating pattern 144 may be surrounded by the carbon-containing oxide layer 142. Each of the inner oxide layer 140 and the carbon-containing oxide layer 142 may include a portion between the direct contact DC and the gap fill insulating pattern 144.

The inner oxide layer 140 may be apart from the contact plug 150 with the carbon-containing oxide layer 142 and the gap fill insulating pattern 144 therebetween.

The intermediate insulating spacer 146 may cover sidewalls of the bit line BL, which is adjacent thereto. The intermediate insulating spacer 146 may be between the carbon-containing oxide layer 142 and the outer insulating spacer 148. The intermediate insulating spacer 146 may include a silicon oxide layer, an air spacer, or a combination thereof. In the present specification, the term "air" may be referred to as the atmosphere or other gases that may be present during a manufacturing process.

A portion of the inner oxide layer 140 may overlap a portion of the carbon-containing oxide layer 142 in the vertical direction (Z direction). The other portion of the inner oxide layer 140 may overlap the other portion of the carbon-containing oxide layer 142 in the first horizontal direction (X direction).

The outer insulating spacer 148 may cover sidewalls of the bit line BL, which is adjacent thereto. The outer insulating spacer 148 may extend in the vertical direction (Z direction) to cover sidewalls of the bit line BL, which is adjacent thereto, with the carbon-containing oxide layer 142 and the intermediate insulating spacer 146 therebetween. The outer insulating spacer 148 may be apart from the carbon-containing oxide layer 142 with the intermediate insulating spacer 146 therebetween. According to an example embodiment, the outer insulating spacer 148 may include a silicon nitride layer.

The at least one protrusion 142PR of the carbon-containing oxide layer 142 may be between the adjacent bit line BL and the outer insulating spacer 148, and may include the protrusion 142PR protruding toward the outer insulating spacer 148.

The inner oxide layer 140, the carbon-containing oxide layer 142, the intermediate insulating spacer 146, and the outer insulating spacer 148 may each extend parallel to the bit line BL in a second horizontal direction (Y direction).

A metal silicide layer 172 and a plurality of conductive landing pads LP may be sequentially formed on each of the plurality of contact plugs 150. The plurality of conductive landing pads LP may be connected to the plurality of contact plugs 150 via the metal silicide layer 172. The plurality of conductive landing pads LP may extend from the space between each of the plurality of insulating capping patterns 136 to the upper portion of each of the plurality of insulating capping patterns 136 so that the plurality of conductive landing pads LP vertically overlap a portion of the plurality of bit lines BL. Each of the plurality of conductive landing pads LP may include a conductive barrier layer 174 and a conductive layer 176.

According to an example embodiment, the metal silicide layer 172 may include cobalt silicide, nickel silicide, or manganese silicide, but is not limited thereto. According to an example embodiment, the metal silicide layer 172 may be omitted. The conductive barrier layer 174 may have a Ti/TiN stack structure. The conductive layer 176 may include doped polysilicon, metal, metal silicide, conductive metal nitride, or a combination thereof. For example, the conductive layer 176 may include tungsten (W). The plurality of conductive landing pads LP may have a plurality of an island-type pattern shapes in a plan view. The plurality of conductive landing pads LP may be electrically insulated from each other by an insulating layer 180 filling a space therearound. According to an example embodiment, the plurality of conductive landing pads LP may be insulated from each other by filling an upper recess space R2 around the plurality of conductive landing pads LP with the insulating layer 180.

Figure 2:
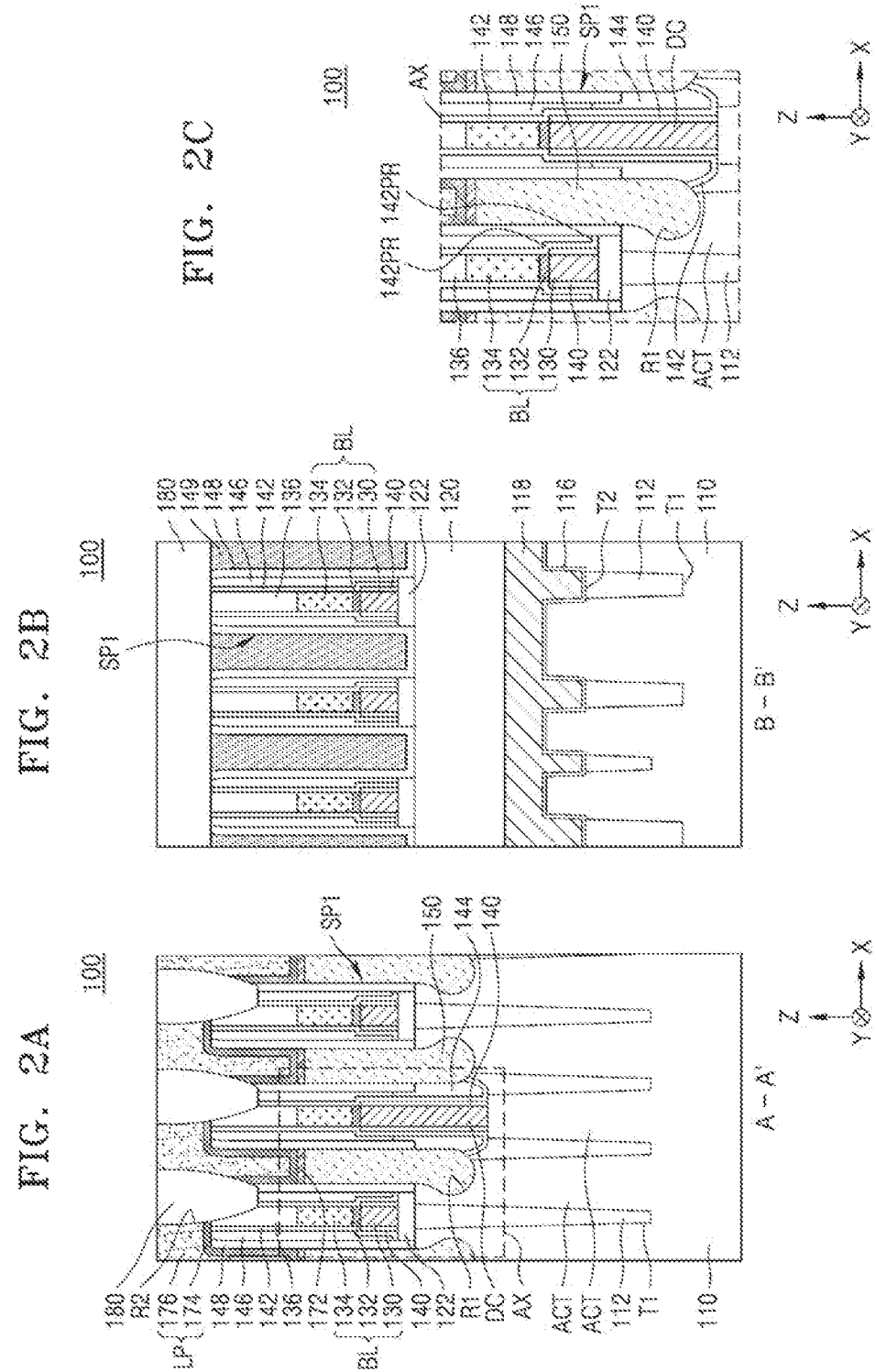
FIGS. 2A, 2B and 2C are cross-sectional views of an integrated circuit device according to an example embodiment of the inventive concept.
Figure 3:
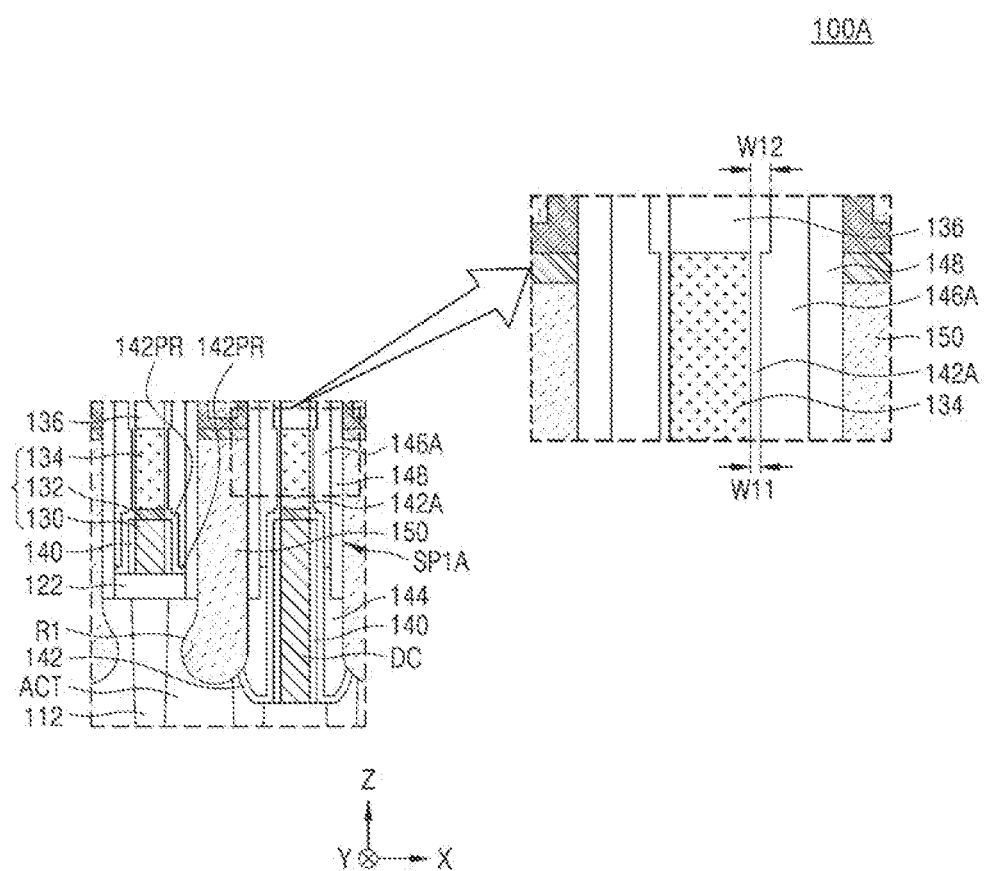
FIGS. 3 through 10 are cross-sectional views of integrated circuit devices according to other example embodiments of the inventive concept.

FIG. 3 is a cross-sectional view of an integrated circuit device 100A according to an embodiment of the inventive concept. In FIG. 3, some components of a portion, of the integrated circuit device 100A, corresponding to the dashed region AX in (a) of FIG. 2 are enlarged.

Referring to FIG. 3, the integrated circuit device 100A may have substantially the same configuration as the integrated circuit device 100 described with reference to FIGS. 2A-2C, particularly the AX region illustrated in FIG. 2C. However, the integrated circuit device 100A may include a plurality of spacer structures SP1A instead of the plurality of spacer structures SP1.

The plurality of spacer structures SP1A may have substantially the same structure as the spacer structures SP1 illustrated in FIGS. 2A-2C. However, the plurality of spacer structures SP1A may include a carbon-containing oxide layer 142A and an intermediate insulating spacer 146A, which have variable thicknesses in the vertical direction (Z direction). According to an example embodiment, the carbon-containing oxide layer 142A may have a non-uniform thicknesses in the vertical direction (Z direction). According to an example embodiment, the intermediate insulating spacer 146A may have a non-uniform thicknesses in the vertical direction (Z direction).

The carbon-containing oxide layer 142A may have substantially the same configuration as that described for the carbon-containing oxide layer 142 with reference to FIGS. 2A-2C. However, a first portion of the carbon-containing oxide layer 142A contacting the bit line BL and a second portion of the carbon-containing oxide layer 142A contacting the insulating capping pattern 136 may have different thicknesses in the vertical direction (Z direction). In the first horizontal direction (X direction), a first thickness W11 of the portion of the carbon-containing oxide layer 142A contacting the upper conductive layer 134 of the bit line BL may be less than a second thickness W12 of a portion contacting the insulating capping pattern 136. This may be due to a difference between deposition characteristics on a surface of the upper conductive layer 134 and deposition characteristics on a surface of the insulating capping pattern 136 in the process for forming the carbon-containing oxide layer 142A, and a difference between reactions of the upper conductive layer 134 and the insulating capping pattern 136 with respect to pre-processing conditions in the pre-processing operation of forming the carbon-containing oxide layer 142.

According to an example embodiment, the carbon-containing oxide layer 142A may have a thickness of about 10 Å to about 30 Å in the first horizontal direction (X direction). The difference between the second thickness W12 and the first thickness W11 of the carbon-containing oxide layer 142A may be about 0.1 Å to about 20 Å, but is not limited thereto.

The intermediate insulating spacer 146A may have substantially the same configuration as that described for the intermediate insulating spacer 146 with reference to FIGS. 2A-2C. However, a width of a first portion of the intermediate insulating spacer 146A facing the upper conductive layer 134 in the first horizontal direction (X direction) may be greater than a width of a second portion of the intermediate insulating spacer 146A. According to an example embodiment, the second portion of the intermediate insulating spacer 146A does not face the upper conductive layer 134.

Figure 4:
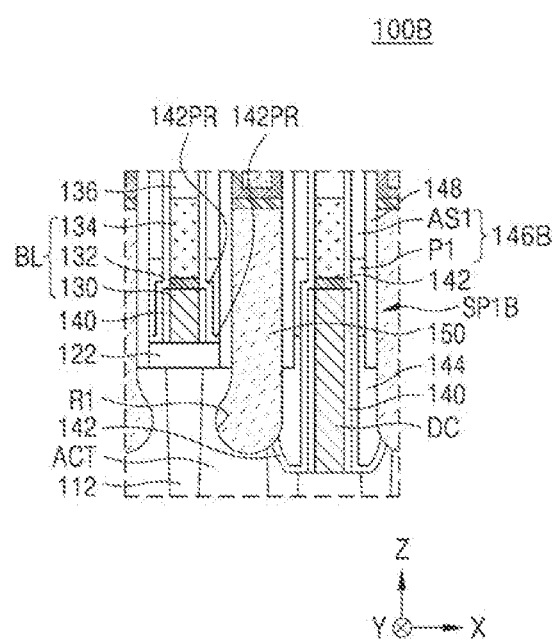

FIG. 4 is a cross-sectional view of an integrated circuit device 100B according to another example embodiment of the inventive concept. In FIG. 4, some components of a portion, of the integrated circuit device 100B, corresponding to the dashed region AX in FIG. 2A are enlarged.

Referring to FIG. 4, the integrated circuit device 100B may have substantially the same configuration as the integrated circuit device 100 described with reference to FIGS. 2A-2C. However, the integrated circuit device 100B may include a plurality of spacer structures SP1B instead of the plurality of spacer structures SP1. The plurality of spacer structures SP1B may have substantially the same structure as the spacer structures SP1 illustrated in FIGS. 2A-2C. However, the plurality of spacer structures SP1B may include an intermediate insulating spacer 146B including an air spacer AS1 and an intermediate insulating spacer pattern P1, instead of the intermediate insulating spacer 146. The intermediate insulating spacer pattern P1 among the air spacer AS1 and the intermediate insulating spacer pattern P1, which constitute the intermediate insulating spacer 146B, may be closer to the substrate 110 (refer to FIGS. 2A-2C).

In the integrated circuit device 100B, because the sidewall of the bit line BL is covered with the intermediate insulating spacer 146B including the air spacer AS1 having a relatively low dielectric constant, undesired parasitic capacitance between the bit line BL and the conductive regions adjacent thereto, for example, the contact plug 150, may be reduced.

Figure 5C:
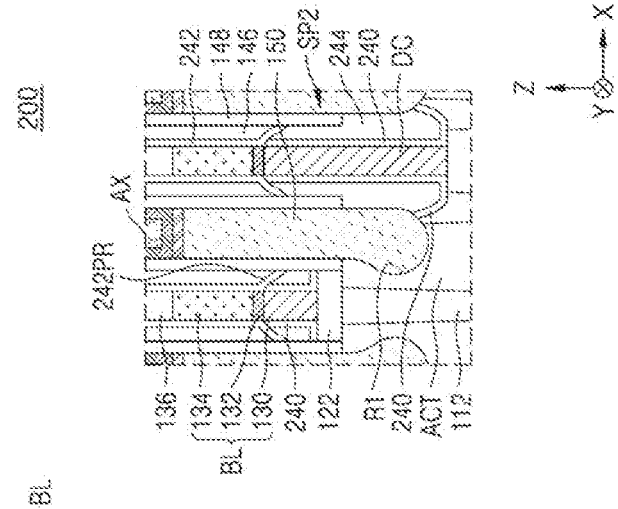
Figure 5B:
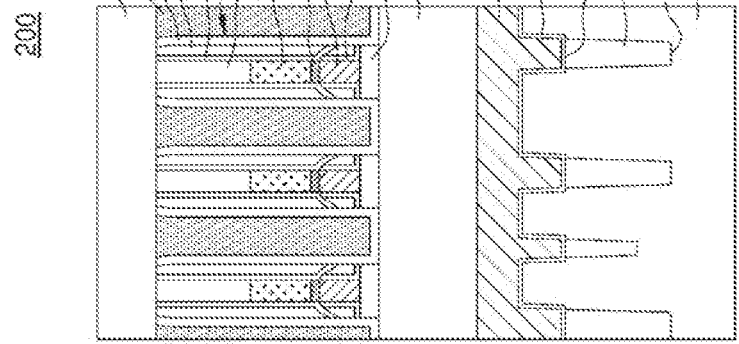
Figure 5A:
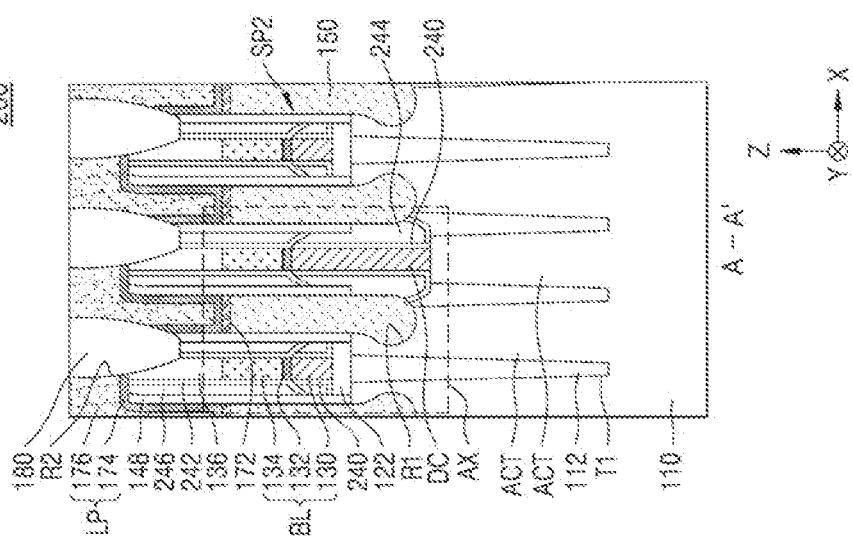

FIGS. 5A-5C are cross-sectional views of an integrated circuit device 200 according to another example embodiment of the inventive concept. FIG. 5A is a cross-sectional view of some components of a portion corresponding to a cross-section taken along line A-A' of FIG. 1, FIG. 5B is a cross-sectional view of some components of a portion corresponding to a cross-section taken along line B-B' of FIG. 1, and FIG. 5C is an enlarged cross-sectional view of a portion corresponding to a dash-lined region AX in FIG. 5A. In FIGS. 5A-5C, the same reference numerals as those in FIGS. 1 and FIGS. 2A-2C denote the same members, and detailed descriptions thereof are omitted.

Referring to FIGS. 5A-5C, the integrated circuit device 200 may have substantially the same configuration as the integrated circuit device 100 described with reference to FIGS. 2A-2C. However, the integrated circuit device 200 may include a plurality of spacer structures SP2 instead of the plurality of spacer structures SP1.

Each of the plurality of spacer structures SP2 may include an inner oxide layer 240, a carbon-containing oxide layer 242, a gap fill insulating pattern 244, an intermediate insulating spacer 246, and the outer insulating spacer 148.

The inner oxide layers 240 may respectively contact a sidewall of the direct contact DC and a sidewall of the lower conductive layer 130 of the bit line BL. The inner oxide layer 240 may include a portion between the direct contact DC and a gap fill insulating pattern 244. The inner oxide layer 240 may include a portion contacting the contact plug 150.

The inner oxide layer 240 may include a silicon oxide layer. When each of the direct contact DC and the lower conductive layer 130 of the bit line BL is a doped polysilicon layer, by forming the inner oxide layer 140 contacting each of the sidewall of the lower conductive layer 130 and the sidewall of the direct contact DC with a silicon oxide layer, formation of a depletion region near the interface of the inner oxide layer 140 in each of the lower conductive layer 130 and the direct contact DC may be prevented, and accordingly, deterioration of electrical characteristics of the lower conductive layer 130 and the direct contact DC may be prevented.

The carbon-containing oxide layer 242 may be apart from the contact plug 150 closest to the carbon-containing oxide layer 242 with the outer insulating spacer 148 therebetween. The carbon-containing oxide layer 242 may not include a portion between the direct contact DC and the gap fill insulating pattern 244.

The gap fill insulating pattern 244 may be between the lower edge of the contact plug 150 and the direct contact DC. The gap fill insulating pattern 244 may contact the direct contact DC and the inner oxide layer 240. In the first horizontal direction (X direction), the gap fill insulating pattern 244 may face the direct contact DC with the inner oxide layer 240 therebetween. The outer insulating spacer 148 may cover the sidewall of the bit line BL and the sidewall of the insulating capping pattern 136 on the gap fill insulating pattern 244.

The carbon-containing oxide layer 242 may contact sidewalls of the intermediate conductive layer 132 and the upper conductive layer 134 of the bit line BL, and a sidewall of the insulating capping pattern 136. The carbon-containing oxide layer 242 may nonlinearly extend on the sidewall of the bit line BL in the vertical direction (Z direction). The carbon-containing oxide layer 242 may include a protrusion 242PR protruding from the adjacent bit line BL toward the outer insulating spacer 148. The protrusion 242PR may be at a higher level than the upper surface of the gap fill insulating pattern 144 in the vertical direction (Z direction).

The outer insulating spacer 148 may be between the carbon-containing oxide layer 242 and the contact plug 150. The carbon-containing oxide layer 242 may not include a portion contacting the direct contact DC.

The carbon-containing oxide layer 242 may include a portion between the bit line BL and the intermediate insulating spacer 146, and a portion contacting the bottom surface of the intermediate insulating spacer 146. A portion of the carbon-containing oxide layer 242 contacting the bottom surface of the intermediate insulating spacer 146 may constitute a protrusion 242PR.

According to an example embodiment, a portion of the carbon-containing oxide layer 242 contacting the bit line BL and the insulating capping pattern 136 may substantially have a constant thickness in the vertical direction (Z direction).

In the integrated circuit device 200, because the sidewall of the bit line BL is covered by the carbon-containing oxide layer 242 having a relatively low dielectric constant, undesired parasitic capacitance between the bit line BL and conductive regions adjacent thereto, for example, the contact plug 150, may be reduced.

The intermediate insulating spacer 246 may cover sidewalls of the bit line BL, which is adjacent thereto. The intermediate insulating spacer 246 may be between the carbon-containing oxide layer 242 and the outer insulating spacer 148. The intermediate insulating spacer 246 may include a silicon oxide layer, an air spacer, or a combination thereof.

A portion of the inner oxide layer 240 may overlap a portion of the carbon-containing oxide layer 242 in the vertical direction (Z direction). The other portion of the inner oxide layer 240 may overlap the other portion of the carbon-containing oxide layer 242 in the first horizontal direction (X direction).

The outer insulating spacer 148 may be apart from the carbon-containing oxide layer 242 with the intermediate insulating spacer 246 therebetween.

The inner oxide layer 240, the carbon-containing oxide layer 122, the intermediate insulating spacer 246, and the outer insulating spacer 148 may each extend parallel to the bit line BL in the second horizontal direction (Y direction).

More detailed configuration of the inner oxide layer 240, the carbon-containing oxide layer 242, the gap fill insulating pattern 244, and the intermediate insulating spacer 246 may be substantially the same as descriptions of the inner oxide layer 140, the carbon-containing oxide layer 142, the gap fill insulating pattern 144, and the intermediate insulating spacer 146 given with reference to FIGS. 2A-2C.

Figure 6:
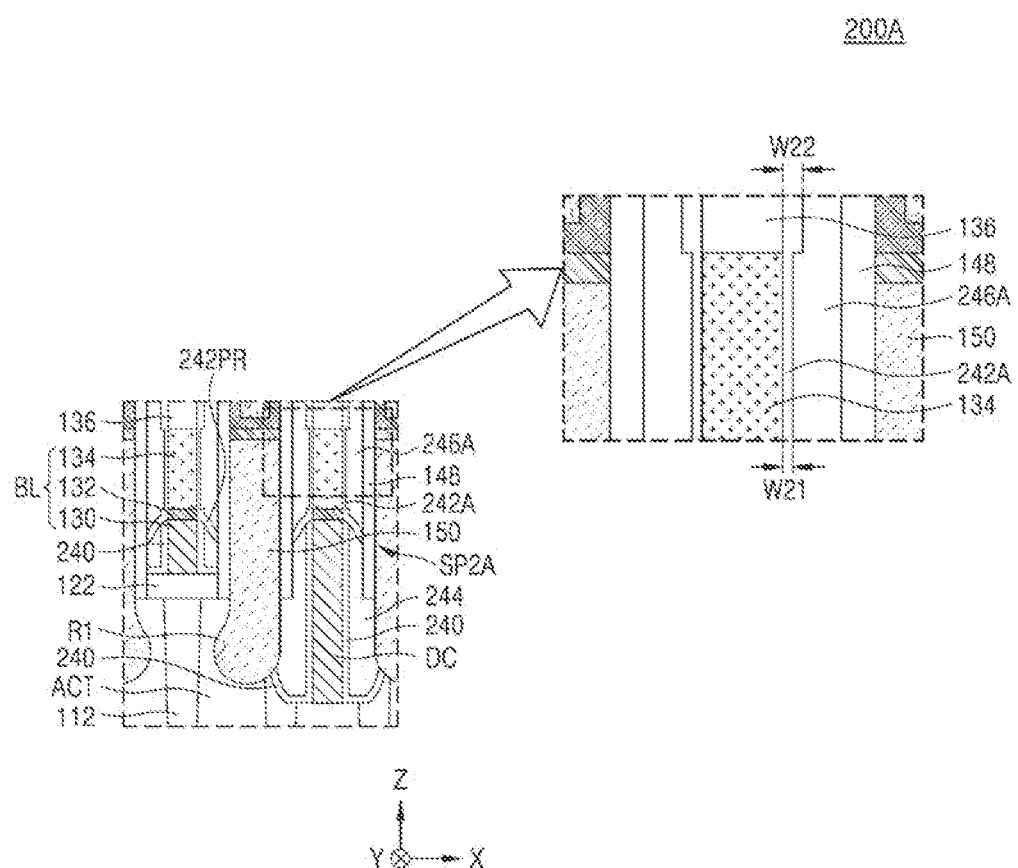

FIG. 6 is a cross-sectional view of an integrated circuit device 200A according to another embodiment of the inventive concept. In FIG. 6, some components of a portion, of the integrated circuit device 200A, corresponding to the dashed region AX in (a) of FIG. 5 are enlarged.

Referring to FIG. 6, the integrated circuit device 200A may have substantially the same configuration as the integrated circuit device 200 described with reference to FIGS. 5A-5C. However, the integrated circuit device 200A may include a plurality of spacer structures SP2A instead of the plurality of spacer structures SP2.

The plurality of spacer structures SP2A may have substantially the same structure as the spacer structures SP2 illustrated in FIGS. 5A-5C. However, the plurality of spacer structures SP2A may include a carbon-containing oxide layer 242A and an intermediate insulating spacer 246A, which have variable thicknesses in the vertical direction (Z direction).

The carbon-containing oxide layer 242A may have substantially the same configuration as that described for the carbon-containing oxide layer 242 with reference to FIGS. 5A-5C. However, a portion of the carbon-containing oxide layer 242A contacting the bit line BL and a portion contacting the insulating capping pattern 136 may have different thicknesses in the vertical direction (Z direction). In the first horizontal direction (X direction), a first thickness W21 of the portion of the carbon-containing oxide layer 242A contacting the upper conductive layer 134 of the bit line BL may be less than a second thickness W22 of a portion contacting the insulating capping pattern 136. The carbon-containing oxide layer 242A may have a thickness of about 10 Å to about 30 Å. The difference between the second thickness W22 and the first thickness W21 of the carbon-containing oxide layer 242A may be about 0.1 Å to about 20 Å, but is not limited thereto.

The intermediate insulating spacer 246A may have substantially the same configuration as that described for the intermediate insulating spacer 246 with reference to FIGS. 5A-5C. However, a width of a portion of the intermediate insulating spacer 246A facing the upper conductive layer 134 in the first horizontal direction (X direction) may be greater than a width of the other portion of the intermediate insulating spacer 246A.

Figure 7:
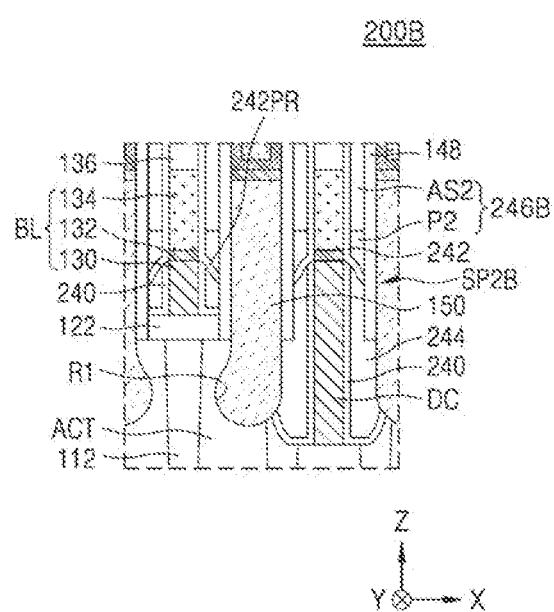

FIG. 7 is a cross-sectional view of an integrated circuit device 200B according to another example embodiment of the inventive concept. In FIG. 7, some components of a portion, of the integrated circuit device 200B, corresponding to the dashed region AX in FIG. 5A are enlarged.

Referring to FIG. 7, the integrated circuit device 200B may have substantially the same configuration as the integrated circuit device 200 described with reference to FIGS. 5A-5C. However, the integrated circuit device 200B may include a plurality of spacer structures SP2B instead of the plurality of spacer structures SP2. The plurality of spacer structures SP2B may have substantially the same structure as the spacer structures SP2 illustrated in FIGS. 5A-5C. However, the plurality of spacer structures SP2B may include an intermediate insulating spacer 246B including an air spacer AS2 and an intermediate insulating spacer pattern P2, instead of the intermediate insulating spacer 246. The intermediate insulating spacer pattern P2 among the air spacer AS2 and the intermediate insulating spacer pattern P2, which constitute the intermediate insulating spacer 246B, may be closer to the substrate 110 (refer to FIGS. 5A-5C).

In the integrated circuit device 200B, because the sidewall of the bit line BL is covered with the intermediate insulating spacer 246B including the air spacer AS2 having a relatively low dielectric constant, undesired parasitic capacitance between the bit line BL and the conductive regions adjacent thereto, for example, the contact plug 150, may be reduced.

Figure 8:
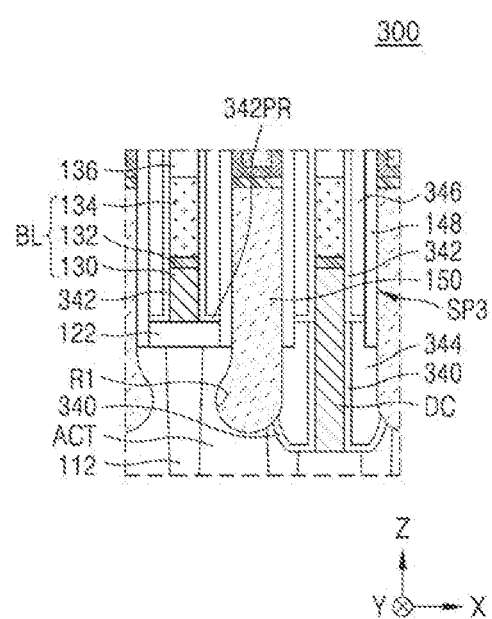

FIG. 8 is a cross-sectional view of an integrated circuit device 300 according to another example embodiment of the inventive concept. In FIG. 8, some components of a portion, of the integrated circuit device 300, corresponding to the dashed region AX in FIG. 5A are enlarged.

Referring to FIG. 8, the integrated circuit device 300 may have substantially the same configuration as the integrated circuit device 200 described with reference to FIGS. 5A-5C. However, the integrated circuit device 300 may include a plurality of spacer structures SP3 instead of the plurality of spacer structures SP2.

The plurality of spacer structures SP3 may have substantially the same structure as the spacer structures SP2 illustrated in FIGS. 5A-5C. However, the plurality of spacer structures SP3 may include an inner oxide layer 340, a carbon-containing oxide layer 342, a gap fill insulating pattern 344, an intermediate insulating spacer 346, and the outer insulating spacer 148.

The inner oxide layer 340 may have substantially the same configuration as the inner oxide layer 240 described with reference to FIGS. 5A-5C. However, an uppermost level of the inner oxide layer 340 may be lower than the uppermost level of the direct contact DC. The sidewall of a portion of the upper side of the direct contact DC and the sidewall of the lower conductive layer 130 of the bit line BL may not be covered with the inner oxide layer 340.

The carbon-containing oxide layer 342 may have substantially the same configuration as the carbon-containing oxide layer 242 described with reference to FIGS. 5A-5C. However, the carbon-containing oxide layer 342 may contact a sidewall of a portion of the upper side of the direct contact DC and a sidewall of the lower conductive layer 130 of the bit line BL.

The gap fill insulating pattern 344 may be between the lower edge of the contact plug 150 and a portion of the bottom surface of the direct contact DC.

The carbon-containing oxide layer 342 may contact the sidewall of each of the lower conductive layer 130, the intermediate conductive layer 132 and the upper conductive layer 134 of the bit line BL, and the sidewall of the insulating capping pattern 136. The carbon-containing oxide layer 342 may nonlinearly extend on the sidewall of the bit line BL in the vertical direction (Z direction). The carbon-containing oxide layer 342 may include a protrusion 342PR protruding from each of the lower conductive layer 130 and the direct contact DC of the adjacent bit line BL toward the outer insulating spacer 148. The protrusion 342PR may be at a higher level than an upper surface of a gap fill insulating pattern 344 in the vertical direction (Z direction). The outer insulating spacer 148 may be between the carbon-containing oxide layer 342 and the contact plug 150. The carbon-containing oxide layer 342 may not include a portion contacting the direct contact DC.

The carbon-containing oxide layer 342 may include a portion between the bit line BL and the intermediate insulating spacer 346, and a portion contacting the bottom surface of the intermediate insulating spacer 346. A portion of the carbon-containing oxide layer 342 contacting the bottom surface of the intermediate insulating spacer 346 may constitute a protrusion 342PR.

According to an example embodiment, a portion of the carbon-containing oxide layer 342 contacting the bit line BL and the insulating capping pattern 136 may substantially have a constant thickness in the vertical direction (Z direction).

In the integrated circuit device 300, because the sidewall of the bit line BL is covered by the carbon-containing oxide layer 342 having a relatively low dielectric constant, undesired parasitic capacitance between the bit line BL and conductive regions adjacent thereto, for example, the contact plug 150, may be reduced.

The intermediate insulating spacer 346 may cover sidewalls of the bit line BL, which is adjacent thereto. The intermediate insulating spacer 346 may be between the carbon-containing oxide layer 342 and the outer insulating spacer 148. The intermediate insulating spacer 346 may include a silicon oxide layer, an air spacer, or a combination thereof.

A portion of the inner oxide layer 340 may overlap a portion of the carbon-containing oxide layer 342 in the vertical direction (Z direction).

More detailed configuration of the inner oxide layer 340, the carbon-containing oxide layer 342, the gap fill insulating pattern 344, and the intermediate insulating spacer 346 may be substantially the same as descriptions of the inner oxide layer 140, the carbon-containing oxide layer 142, the gap fill insulating pattern 144, and the intermediate insulating spacer 146 given with reference to FIGS. 2A-2C.

Figure 9:
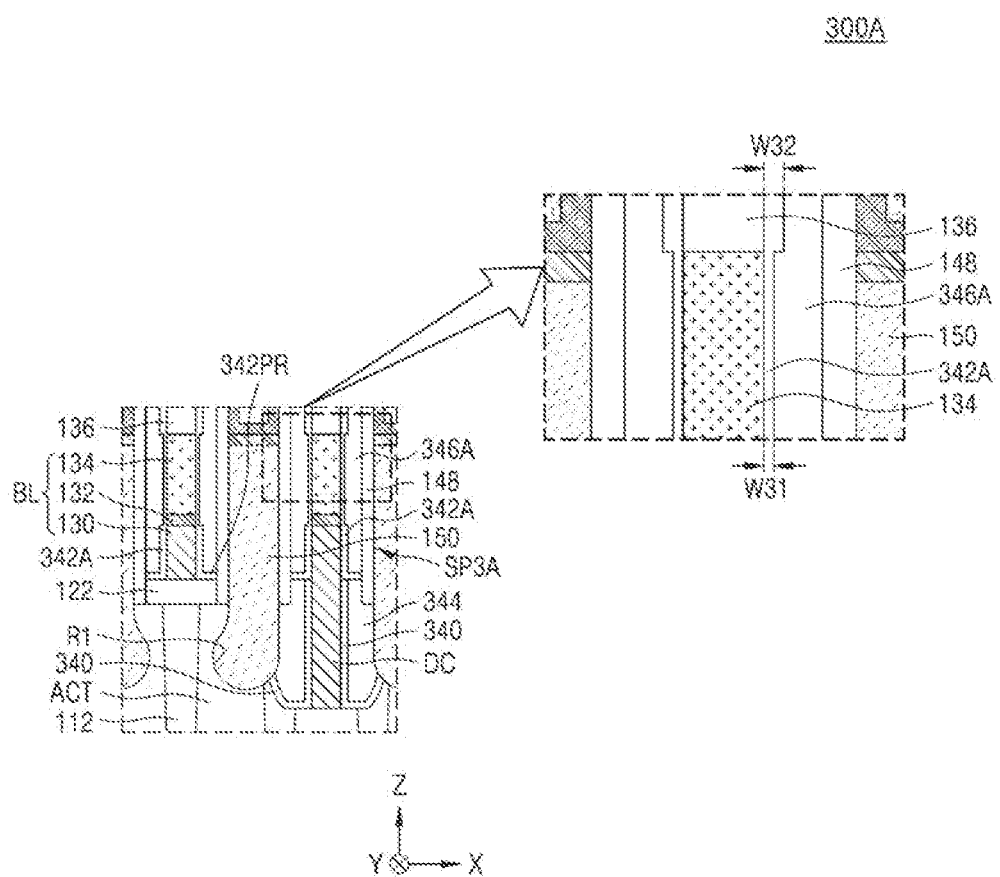

FIG. 9 is a cross-sectional view of an integrated circuit device 300A according to another embodiment of the inventive concept. In FIG. 9, some components of a portion, of the integrated circuit device 300A, corresponding to the dashed region AX in FIG. 5A are enlarged.

Referring to FIG. 9, the integrated circuit device 300A may have substantially the same configuration as the integrated circuit device 300 described with reference to FIG. 8. However, the integrated circuit device 300A may include a plurality of spacer structures SP3A instead of the plurality of spacer structures SP3.

The plurality of spacer structures SP3A may have substantially the same structure as the spacer structures SP3 illustrated in FIG. 8. However, the plurality of spacer structures SP3A may include a carbon-containing oxide layer 342A and an intermediate insulating spacer 346A, which have variable thicknesses in the vertical direction (Z direction).

The carbon-containing oxide layer 342A may have substantially the same configuration as that described for the carbon-containing oxide layer 342 with reference to FIG. 8. However, a portion of the carbon-containing oxide layer 342A contacting the bit line BL and a portion contacting the insulating capping pattern 136 may have different thicknesses in the vertical direction (Z direction). In the first horizontal direction (X direction), a first thickness W31 of the portion of the carbon-containing oxide layer 342A contacting the upper conductive layer 134 of the bit line BL may be less than a second thickness W32 of a portion of the carbon-containing oxide layer 342A contacting the insulating capping pattern 136. The carbon-containing oxide layer 342A may have a thickness of about 10 Å to about 30 Å. The difference between the second thickness W32 and the first thickness W31 of the carbon-containing oxide layer 342A may be about 0.1 Å to about 20 Å, but is not limited thereto.

The intermediate insulating spacer 346A may have substantially the same configuration as that described for the intermediate insulating spacer 346 with reference to FIG. 8. However, a width of a portion of the intermediate insulating spacer 346A facing the upper conductive layer 134 in the first horizontal direction (X direction) may be greater than a width of the other portion of the intermediate insulating spacer 346A.

Figure 10:
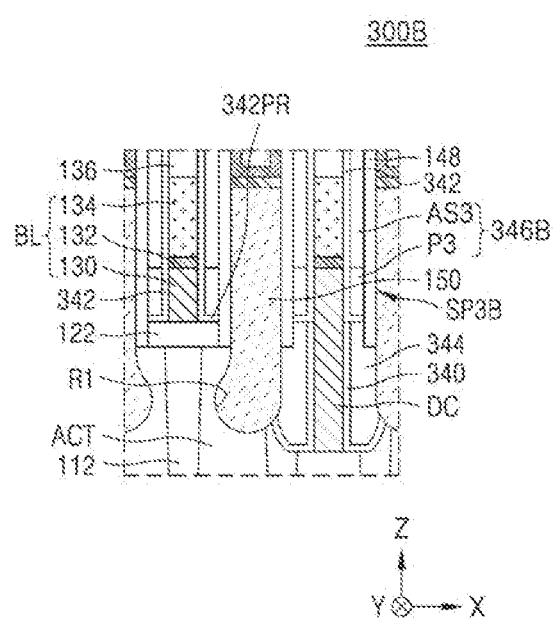

FIG. 10 is a cross-sectional view of an integrated circuit device 300B according to another example embodiment of the inventive concept. In FIG. 10, some components of a portion, of the integrated circuit device 300B, corresponding to the dashed region AX in FIG. 5A are enlarged.

Referring to FIG. 10, the integrated circuit device 300B may have substantially the same configuration as the integrated circuit device 300 described with reference to FIG. 8. However, the integrated circuit device 300B may include a plurality of spacer structures SP3B instead of the plurality of spacer structures SP3. The plurality of spacer structures SP3B may have substantially the same structure as the spacer structures SP3 illustrated in FIG. 8. However, the plurality of spacer structures SP3B may include an intermediate insulating spacer 346B including an air spacer AS3 and an intermediate insulating spacer pattern P3, instead of the intermediate insulating spacer 346.

In the integrated circuit device 300B, because the sidewall of the bit line BL is covered with the intermediate insulating spacer 346B including the air spacer AS3 having a relatively low dielectric constant, undesired parasitic capacitance between the bit line BL and the conductive regions adjacent thereto, for example, the contact plug 150, may be reduced.

Figure 11A:
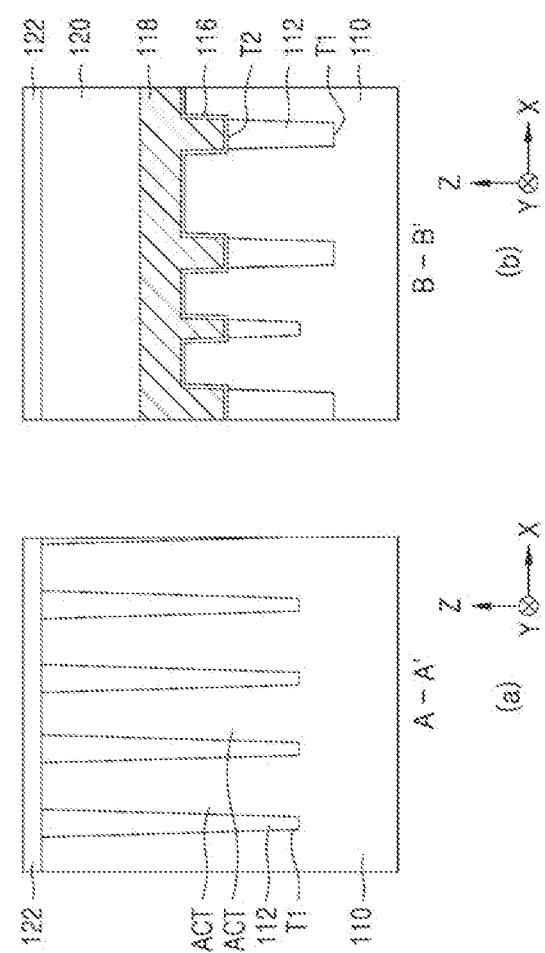
FIGS. 11A through 11O are cross-sectional views illustrating a manufacturing method of an integrated circuit device according to process sequences, according to example embodiments of the inventive concept.

FIGS. 11A through 11O are cross-sectional views illustrating a method of manufacturing an integrated circuit device according to process sequences, according to the technical idea of the inventive concept. In FIGS. 11A through 11O, (a) is a cross-sectional view of some components according to a process sequence of some region corresponding to a cross-section taken along line A-A' in FIG. 1, and (b) is a cross-sectional view of some components according to a process sequence of some region corresponding to a cross-section taken along line B-B' in FIG. 1. In FIGS. 11G through 11O, (c) is an enlarged cross-sectional view of a portion corresponding to the dash-lined region AX in (a) of the corresponding figure. A manufacturing method of the integrated circuit device 100 illustrated in FIGS. 2A, 2B and 2C is described with reference to FIGS. 11A through 11O.

Referring to FIG. 11A, the device isolation trench T1 may be formed in the substrate 110, and the device isolation layer 112 may be formed in the device isolation trench T1. The plurality of active regions ACT may be defined in the substrate 110 by the element isolation layer 112.

The plurality of word line trenches T2 may be formed in the substrate 110. The plurality of word line trenches T2 may extend parallel to each other in the first horizontal direction (X direction), and may have a line shape crossing the active region ACT. According to an example embodiment, in order to form the plurality of word line trenches T2 including steps on the bottom surface thereof, each of the device isolation layer 112 and the substrate 110 may be etched by a separate etching process, and an etching depth of the device isolation layer 112 may be manufactured different from an etching depth of the substrate 110. After cleaning the result of forming the plurality of word line trenches T2, the gate dielectric layer 116, the word line 118, and the buried insulating layer 120 may be sequentially formed in each of the plurality of word line trenches T2. Before or after forming the plurality of word lines 118, an ion implantation process for forming a plurality of source/drain regions on the plurality of active regions ACT may be performed.

The buffer layer 122 may be formed on the substrate 110. The buffer layer 122 may cover top surfaces of the plurality of active regions ACT, a top surface of the device isolation layer 112, and top surfaces of the plurality of buried insulating layers 120. The buffer layer 122 may include a first silicon oxide layer, a silicon nitride layer, and a second silicon oxide layer sequentially formed on the substrate 110, but is not limited thereto.

Figure 11B:
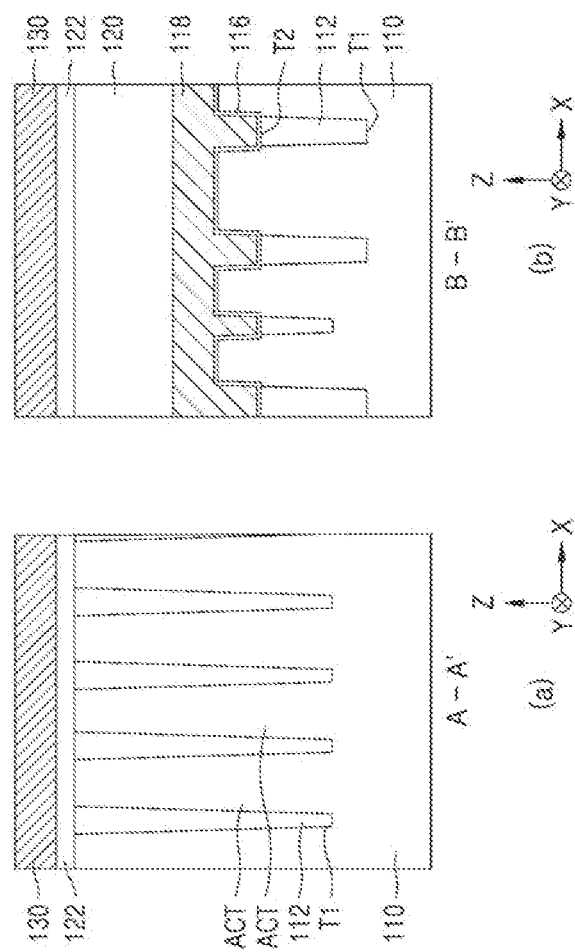

Referring to FIG. 11B, the lower conductive layer 130 may be formed on the buffer layer 122. The lower conductive layer 130 may include a doped polysilicon layer.

Figure 11C:
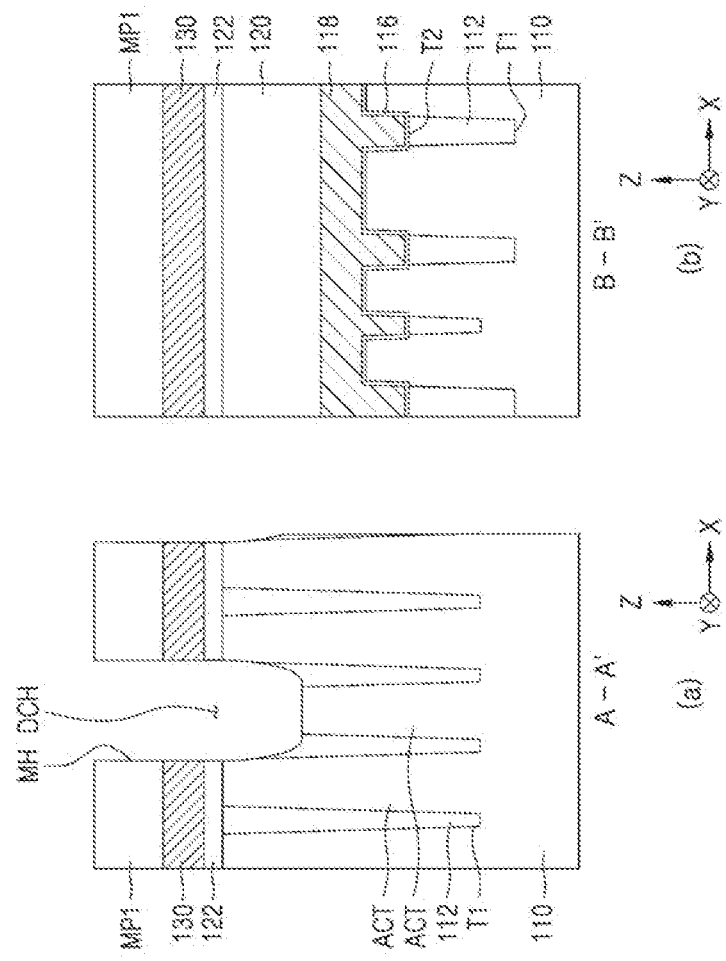

Referring to FIG. 11C, after forming the mask pattern MP1 on the lower conductive layer 130, a direct contact hole DCH exposing the active region ACT of the substrate 110 may be formed by etching a portion of each of the lower conductive layer 130 exposed through an opening MH of the mask pattern MP1, the buffer layer 122 below the mask pattern MP1, and the device isolation layer 112. The mask pattern MP1 may include an oxide layer, a nitride layer, or a combination thereof, but is not limited thereto.

Figure 11D:
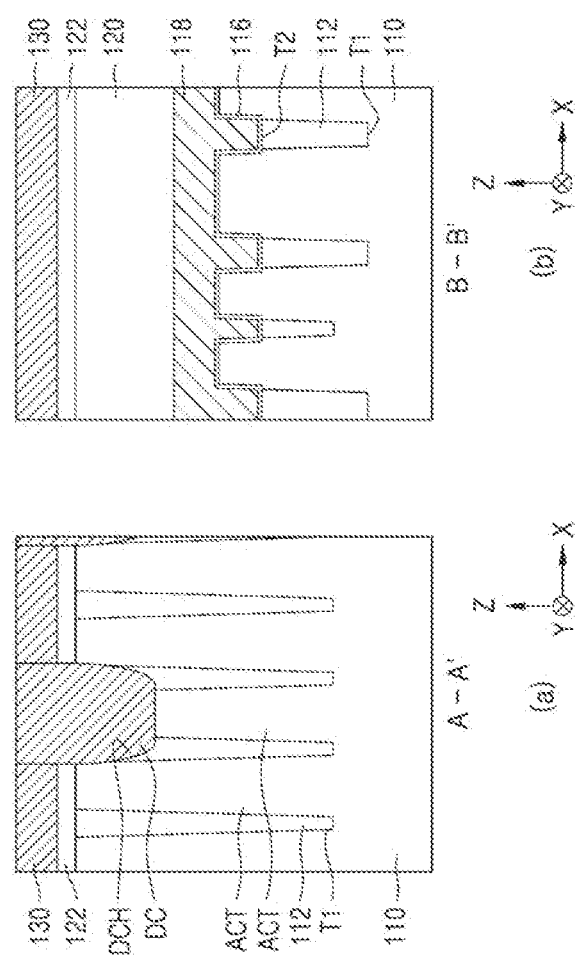

Referring to FIG. 11D, the mask pattern MP1 may be removed from the result illustrated in FIG. 11C, and the direct contact DC may be formed in a direct contact hole DCH.

According to an example embodiment, in order to form the direct contact DC, a doped polysilicon layer having a thickness sufficient to fill the inside of the direct contact hole DCH and the direct contact hole DCH on the upper portion of the bottom conductive layer 130 may be formed, and then an unnecessary portion of the doped polysilicon layer may be removed so that the doped polysilicon layer remains only in the direct contact hole DCH.

Figure 11E:
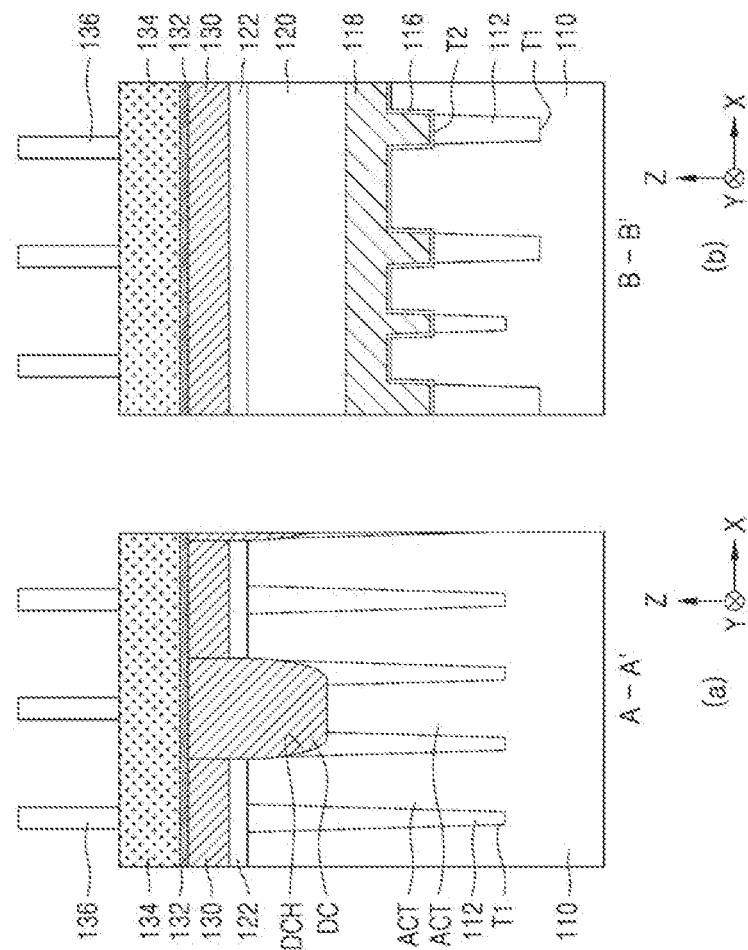

Referring to FIG. 11E, the intermediate conductive layer 132, the upper conductive layer 134, and the plurality of insulating capping patterns 136 may be sequentially formed on the lower conductive layer 130 and the direct contact DC. Each of the plurality of insulating capping patterns 136 may be formed of a line pattern extending long in the second horizontal direction (Y direction).

Figure 11F:
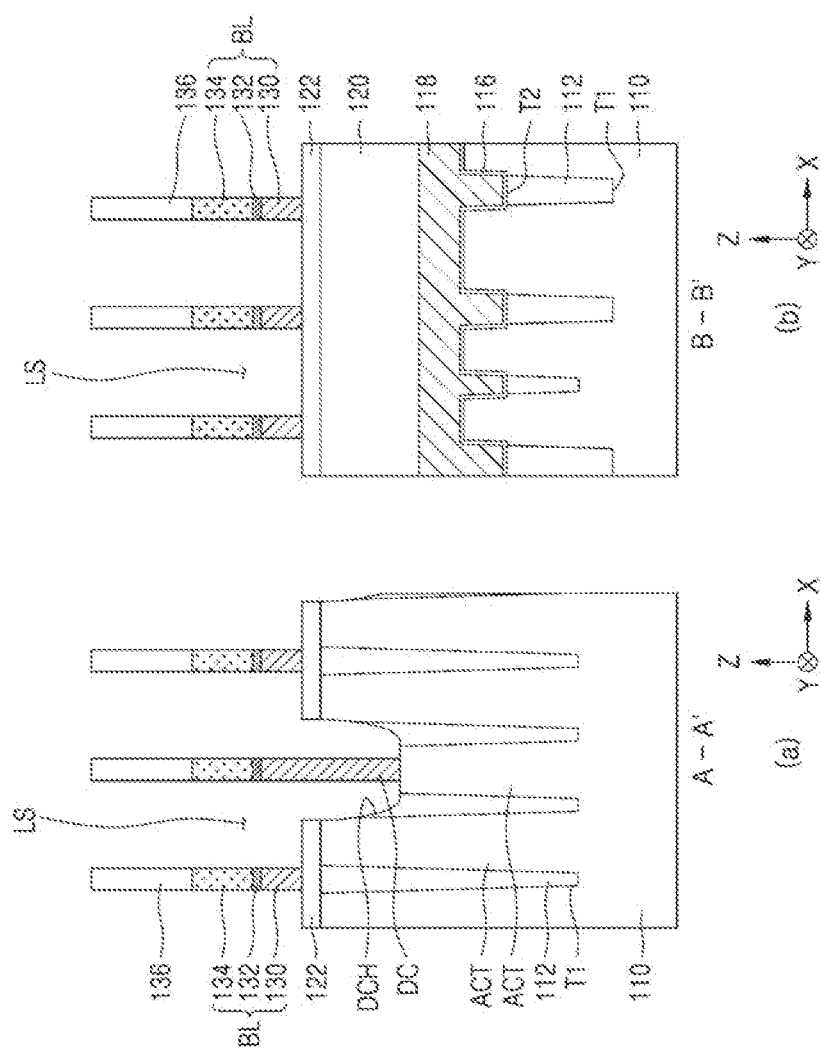

Referring to FIG. 11F, a portion of each of the upper conductive layer 134, the intermediate conductive layer 132, the lower conductive layer 130, and the direct contact DC may be etched by using the insulating capping pattern 136 as an etching mask to form the plurality of bit lines BL on the substrate 110. The plurality of bit lines BL may include remaining portions of each of the lower conductive layer 130, the intermediate conductive layer 132, and the upper conductive layer 134. After the plurality of bit lines BL are formed, a portion of the direct contact hole DCH may be exposed around the direct contact DC again, and a line space LS extending long in the second horizontal direction (Y direction) may be defined between each of the plurality of bit line structures each including the bit line BL and the insulating capping pattern 136.

Referring to FIG. 11G, the plurality of inner oxide layers 140 selectively covering the sidewall of each of the lower conductive layer 130 and the direct contact DC exposed in the resultant illustrated in FIG. 11F may be formed. The inner oxide layer 140 may contact both sidewalls of each of the lower conductive layer 130 and the direct contact DC. According to an example embodiment, a selective oxidation process may be performed on the exposed surfaces of each of the lower conductive layer 130 and the direct contact DC to form the plurality of inner oxide layers 140.

Figure 11H:
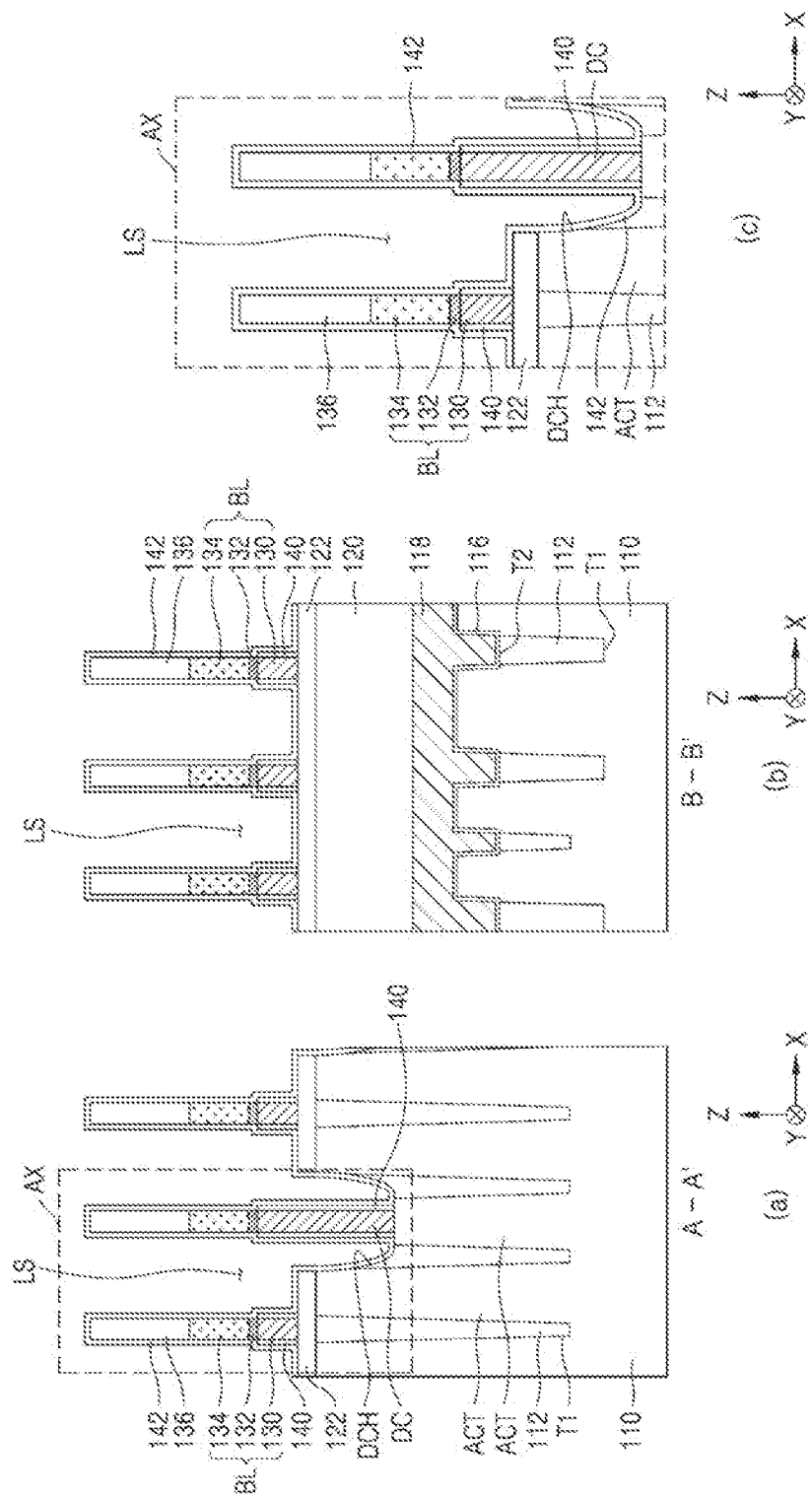

Referring to FIG. 11H, the carbon-containing oxide layer 142 covering the surface exposed after the formation of the inner oxide layers 140 illustrated in FIG. 11G may be formed. For instance, the carbon-containing oxide layer 142 may be formed to conform to the exposed layers, so as to cover the exposed layers in FIG. 11G. The carbon-containing oxide layer 142 may contact each of the inner oxide layer 140, the intermediate conductive layer 132, the upper conductive layer 134, and the plurality of insulating capping patterns 136.

A chemical vapor deposition (CVD) process or an atomic layer deposition (ALD) process may be used to form the carbon-containing oxide layer 142.

According to an example embodiment, the carbon-containing oxide layer 142 may substantially have a constant thickness in the vertical direction (Z direction) on the sidewall of the bit line BL and the sidewall of the insulating capping pattern 136. In other exemplary embodiments, by using the difference between deposition characteristics on the surface of the upper conductive layer 134 and deposition characteristics on the surface of the insulating capping pattern 136, the difference between reactions of the upper conductive layer 134 and the insulating capping pattern 136 with respect to pre-processing conditions in the pre-processing operation of forming the carbon-containing oxide layer 142 or the like, the carbon-containing layer 142A illustrated in FIG. 3, instead of the carbon-containing oxide layer 142, may be formed.

Figure 11I:
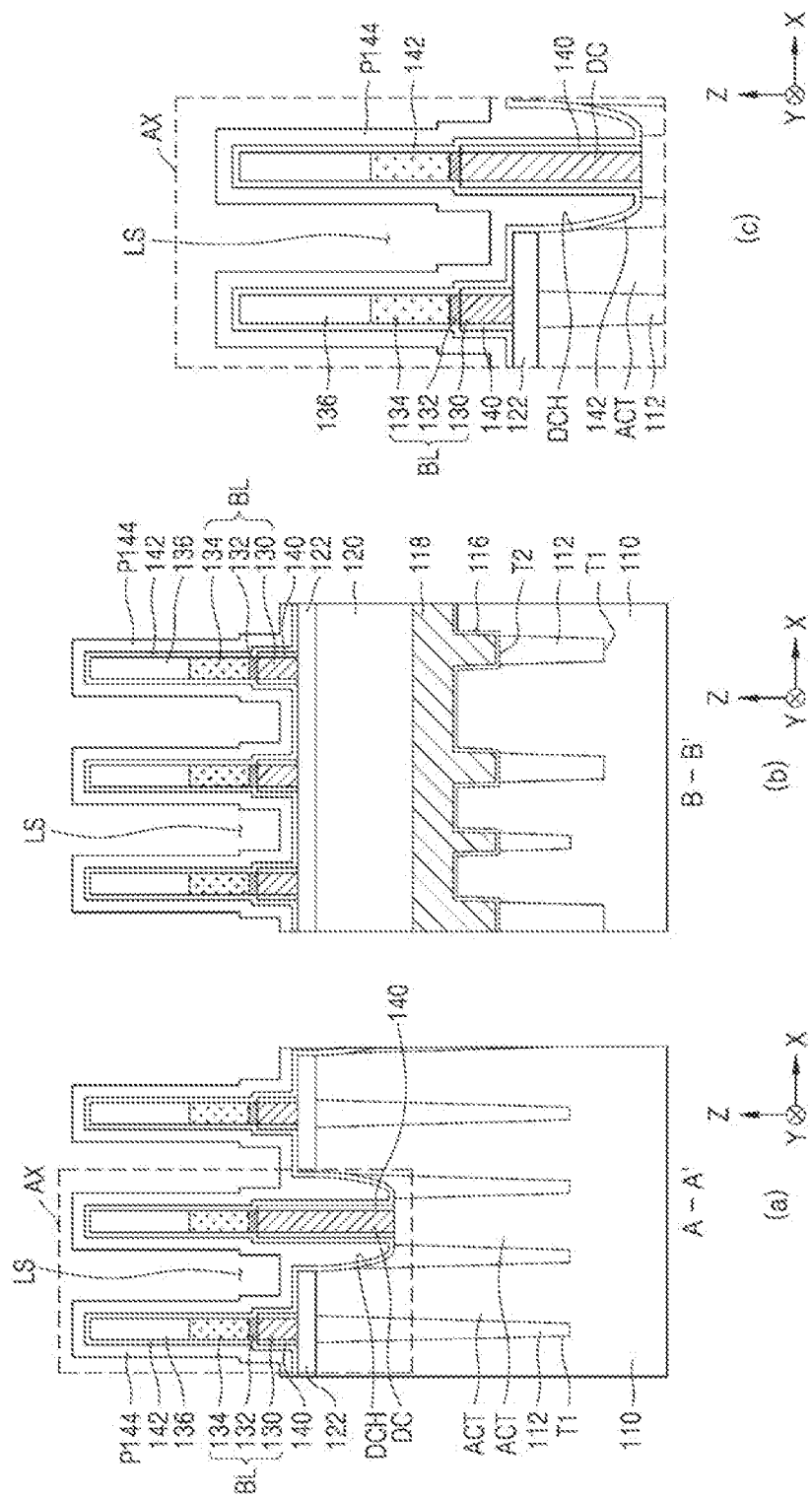

Referring to FIG. 11I, a gap fill insulating layer P144 covering sidewalls of each of the plurality of bit lines BL, the plurality of insulating capping patterns 136, and the plurality of direct contacts DC while filling a remaining space of the direct contact hole DCH in the result illustrated in FIG. 11H may be formed.

According to an example embodiment, the gap fill insulating layer P144 may include a silicon nitride layer. A CVD or ALD process may be used to form the gap fill insulating layer P144.

Figure 11J:
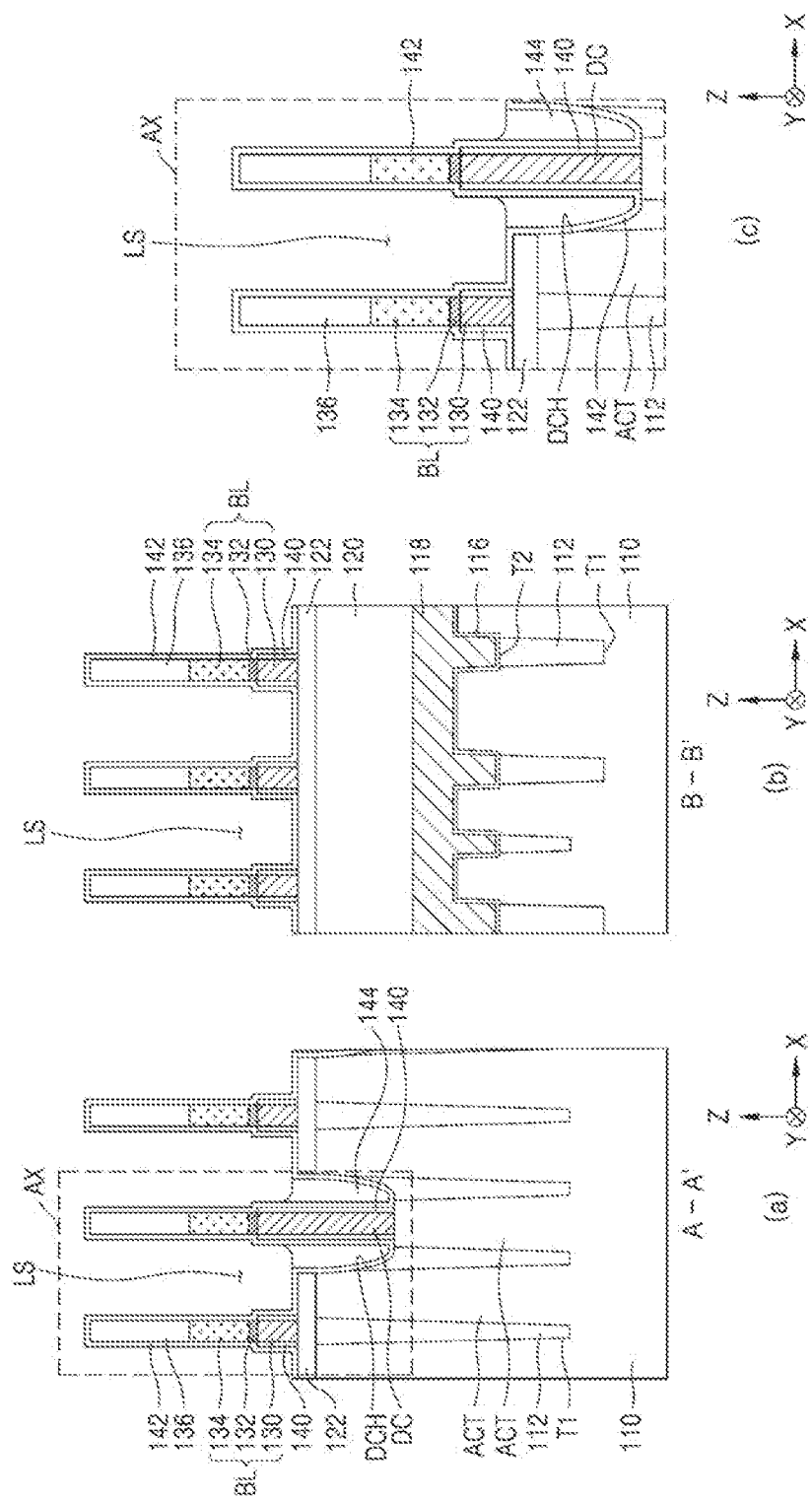

Referring to FIG. 11J, the gap fill insulating layer P144 from the result illustrated in FIG. 11I may be isotropically etched to form the gap fill insulating pattern 144 including the remaining portion of the gap fill insulating layer P144. While the gap fill insulating layer P144 is isotropically etched, the carbon-containing oxide layer 142 may function as an etch stop layer. The gap fill insulating pattern 144 may include a portion of the gap fill insulating layer P144 that fills the inside of the direct contact hole DCH, and a portion covering an entrance of the direct contact hole DCH from the outside of the entrance of the direct contact hole DCH.

Referring to FIG. 11K, after an intermediate insulating spacer layer conformally covering the surfaces exposed from the result illustrated in FIG. 11J by using a CVD or ALD process is formed, the plurality of intermediate insulating spacers 146 may be formed from the intermediate insulating spacer layer by isotropically etching the intermediate insulating spacer layer.

While the intermediate insulating spacer layer is anisotropically etched to form the plurality of intermediate insulating spacers 146, a portion of the buffer layer 122 and a portion of the carbon-containing oxide layer 142 covering the buffer layer 122 may be removed. As a result, a portion of the substrate 110, a portion of the carbon-containing oxide layer 142, and a portion of the gap fill insulating pattern 144 may be exposed at a bottom of a plurality of line spaces LS. Each of the plurality of intermediate insulating spacers 146 may cover the sidewall of the bit line BL and the sidewall of the insulating capping pattern 136 on the carbon-containing oxide layer 142.

The plurality of intermediate insulating spacers 146 may include a material different from the material of the carbon-containing oxide layer 142 and the material of the gap fill insulating pattern 144. The plurality of intermediate insulating spacers 146 may include a material having an etching selectivity with respect to the carbon-containing oxide layer 142 and the gap fill insulating pattern 144. For example, the plurality of intermediate insulating spacers 146 may include a silicon oxide layer.

Referring to FIG. 11L, the outer insulating spacer 148 conformally covering the result illustrated in FIG. 11K may be formed. The outer insulating spacer 148 may include a material having an etch selectivity with respect to the plurality of intermediate insulating spacers 146. For example, the outer insulating spacer 148 may include a silicon nitride layer. A CVD or ALD process may be used to form the outer insulating spacer 148.

Figure 11M:
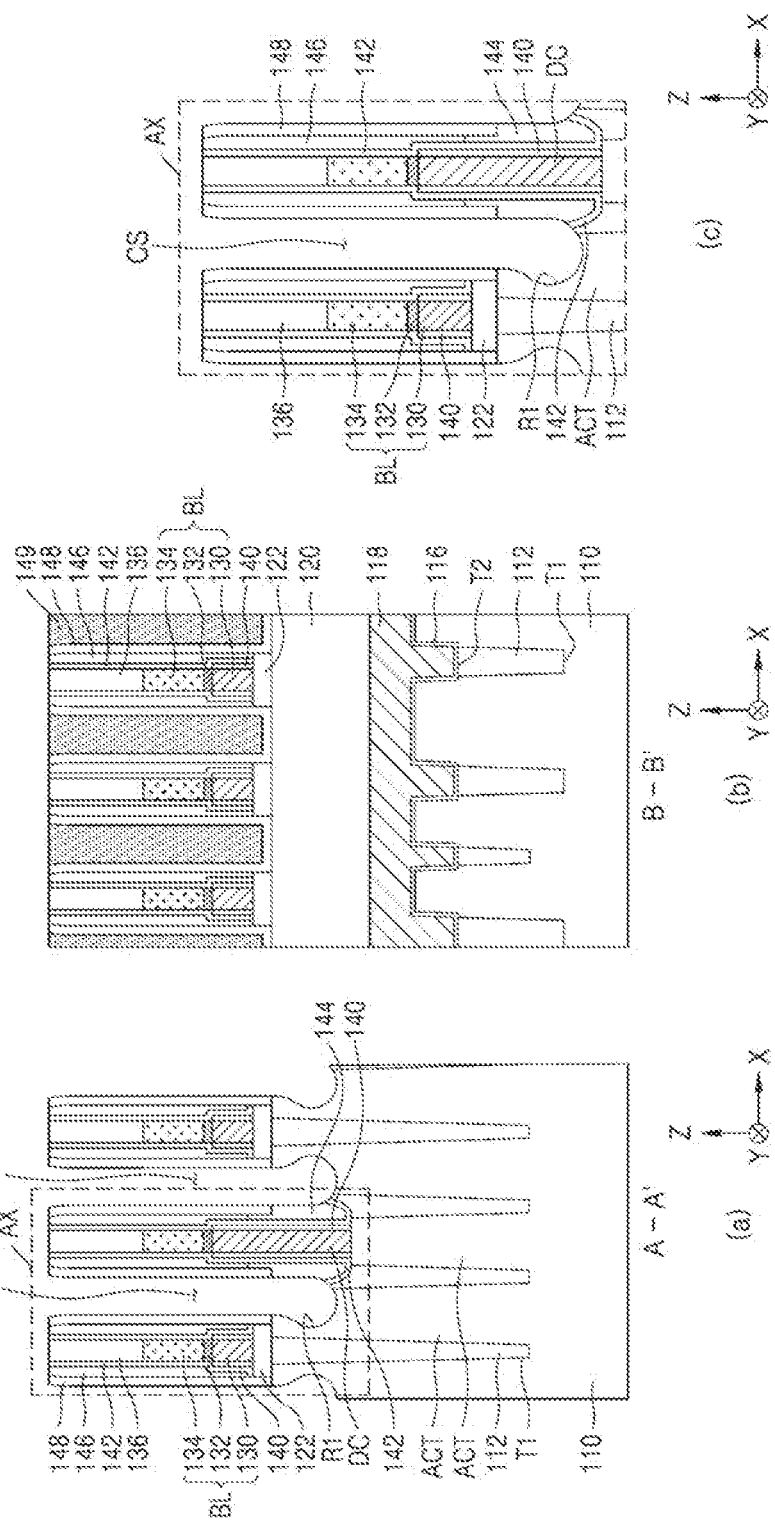

Referring to FIG. 11M, the line space LS may be divided into a plurality of contact spaces CS by forming the plurality of insulating fences 149 apart from each other in the line space LS defined by the outer insulating spacer 148 between each of the bit lines BL from the result illustrated in FIG. 11L.

Each of the plurality of insulating fences 149 may vertically overlap the word line 118 on the word line 118. The plurality of insulating fences 254 may include a silicon nitride layer. According to an example embodiment, while the plurality of insulating fences are formed, a portion of the plurality of insulating capping patterns 136 may be consumed, and a height of the plurality of insulating capping patterns 136 may be reduced.

Next, by removing a portion of structures that are exposed via the plurality of contact spaces CS, the plurality of recess spaces R1 that expose the active region ACT of the substrate 110 between each of the plurality of bit lines BL may be formed. To form the plurality of recess spaces R1, an anisotropic etching process or a combination of an anisotropic etching process and an isotropic etching process may be used. For example, the plurality of recess spaces R1 may be formed by anisotropically etching a portion of the outer insulating spacer 148 exposed via the plurality of contact spaces CS between each of the plurality of bit lines BL and a portion of the substrate 110 under the outer insulating spacer 148, and by isotropically etching a portion of the active region ACT of the substrate that is exposed as a result of the anisotropical etching. Each of the plurality of recess spaces R1 may communicate with the contact space CS. While the etching process for forming the contact space CS is performed, a portion of each of the inner insulating spacer 142 and the gap fill insulating pattern 144 may be consumed in a region adjacent to the top surface of the substrate 110.

A portion of the active region ACT of the substrate 110, a portion of the carbon-containing oxide layer 142, and a portion of the gap fill insulating pattern 144 may be exposed through the plurality of recess spaces R1.

Figure 11N:
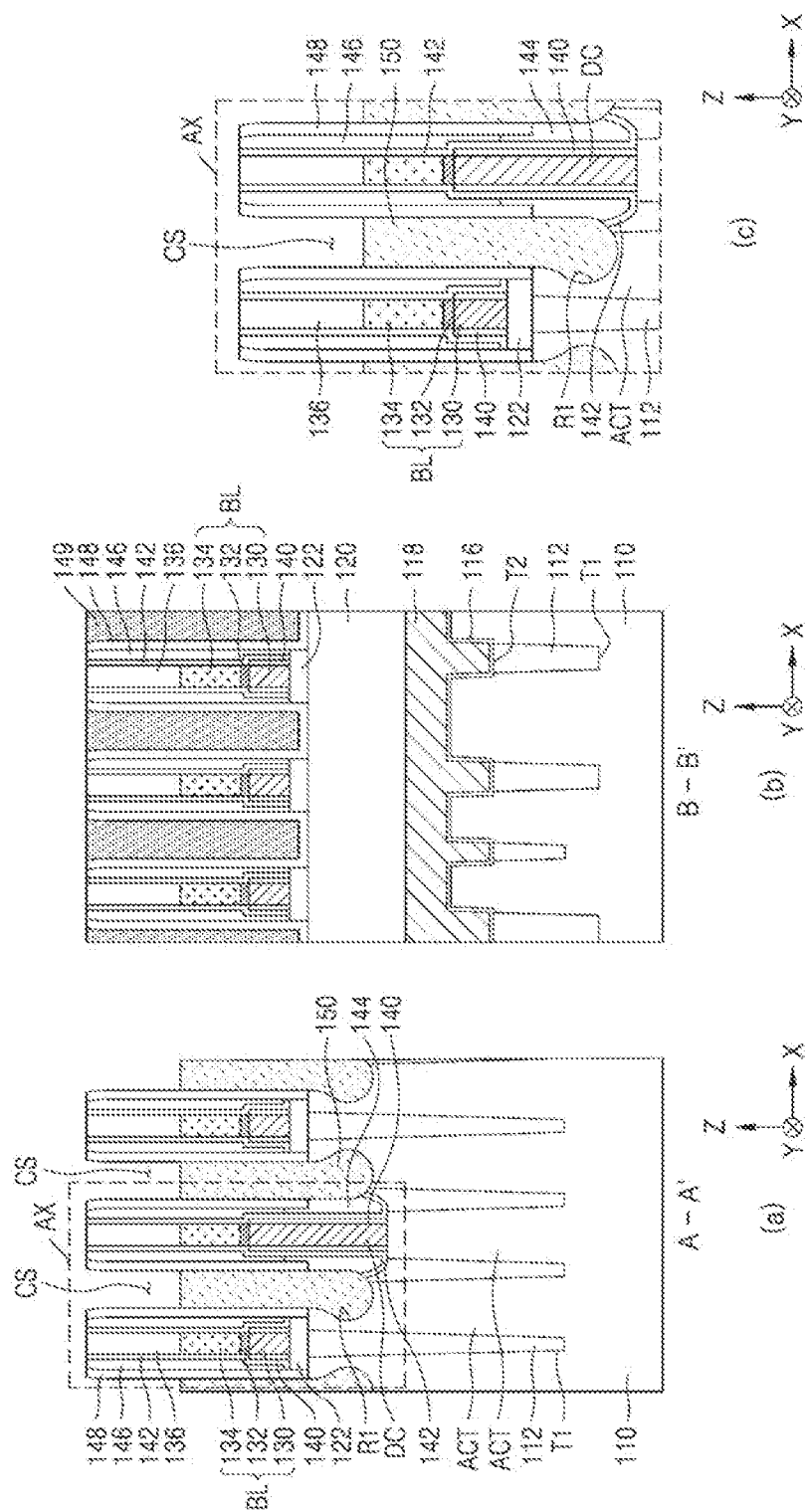
Figure 110:
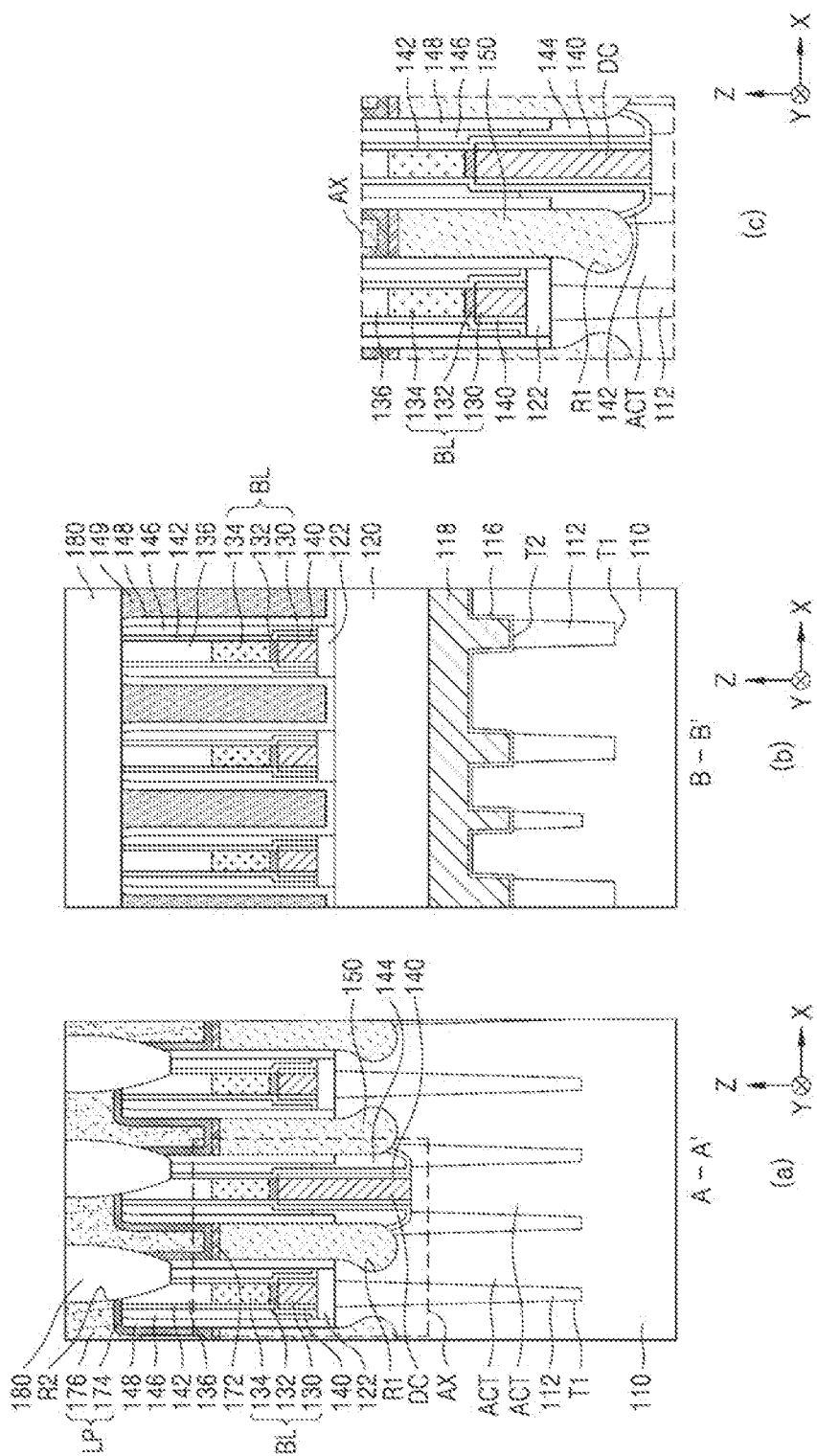

Referring to FIG. 11N, the plurality of contact plugs 150 filling a portion of the contact space CS between each of the plurality of bit lines BL while filling the plurality of recess spaces R1 between each of a plurality of bit lines BL may be formed.

Referring to FIG. 11O, the metal silicide layer 172 and the plurality of conductive landing pads LP may be sequentially formed on the plurality of contact plugs 150 exposed through the plurality of contact spaces CS (refer to FIG. 11N).

The contact plug 150 and the metal silicide layer 172 may form at least a portion of the buried contact BC illustrated in FIG. 1. The plurality of conductive landing pads LP may extend to the upper portion of the insulating capping pattern 136 while filling the plurality of contact spaces CS on the metal silicide layer 172 and vertically overlapping a portion of the plurality of bit lines BL. Each of the plurality of conductive landing pads LP may include the conductive barrier layer 174 and the conductive layer 176.

To form the plurality of conductive landing pads LP, after the conductive barrier layer 174 and the conductive layer 176 are formed on a front side of the result in which the metal silicide layer 172 has been formed, by forming a mask pattern (not illustrated) exposing a portion of the conductive layer 176 on the conductive layer 176, and etching the conductive layer 176, the conductive barrier layer 174, and insulating layers therearound by using the mask pattern as an etching mask, an upper recess space R2 may be formed. The mask pattern may include a silicon nitride layer, but is not limited thereto.

The plurality of conductive landing pads LP may have a plurality of an island-type pattern shapes. Portions of the plurality of conductive landing pads LP extending in the horizontal direction from the outside of the contact space CS may constitute the plurality of conductive landing pads LP illustrated in FIG. 1.

The plurality of conductive landing pads LP may be insulated from each other by filling the upper recess space R2 around the plurality of conductive landing pads LP with the insulating layer 180. Next, a plurality of capacitor lower electrodes capable of being electrically connected to the plurality of conductive landing pads LP may be formed on the insulating layer 180.

According to an example embodiment, after the upper recess space R2 around the plurality of conductive landing pads LP is formed in the process described with reference to FIG. 11O, and before the upper recess space R2 is filled with the insulating layer 180, at least a portion of the silicon oxide layer constituting the plurality of intermediate insulating spacers 146 may be removed through the upper recess space R2.

In an example, the silicon oxide layer constituting the plurality of intermediate insulating spacers 146 may be completely removed through the upper recess space R2 so that the intermediate insulating spacer 146 is formed as an air spacer.

According to another example embodiment, in order to manufacture the integrated circuit device 100B illustrated in FIG. 4, after the upper recess space R2 is formed in the process described with reference to FIG. 11O, and before the upper recess space R2 is filled with the insulating layer 180, the air spacer AS1 may be formed by removing a portion of the silicon oxide layer constituting the plurality of intermediate insulating spacer 146 through the upper recess space R2, and the intermediate insulating spacer pattern P1 including a remaining portion of the silicon oxide layer at the bottom portion of the air spacer AS1 may be maintained.

FIGS. 12A through 12H are cross-sectional views illustrating a method of manufacturing an integrated circuit device according to another example embodiment of the inventive concept. In FIGS. 12A through 12H, (a) is a cross-sectional view of some components according to a process sequence of a portion corresponding to a cross-section taken along line A-A' of FIG. 1, (b) is a cross-sectional view of some components according to a process sequence of a portion corresponding to a cross-section taken along line B-B' of FIG. 1, and (c) is an enlarged cross-sectional view of a portion corresponding to a dash-lined region AX in (a). An example manufacturing method of the integrated circuit device 200 illustrated in FIGS. 5A-5C are described with reference to FIGS. 12A through 12H. In FIGS. 12A through 12H, the same reference numerals as those in FIGS. 1 through 11O may denote the same members, and descriptions thereof are omitted here.

Referring to FIG. 12A, after the plurality of bit lines BL and the direct contacts DC are formed on the substrate 110 by performing the processes described with reference to FIGS. 11A through 11F, a preliminary inner oxide layer P240 covering the exposed surfaces after the formation of the plurality of bit lines BL and the direct contacts DC may be formed. The preliminary inner oxide layer P240 may include a silicon oxide layer. A CVD or ALD process may be used to form the preliminary inner oxide layer P240.

Next, a gap fill insulating layer P244 may be formed on the preliminary inner oxide layer P240 in a similar manner to that described with reference to FIG. 11I. The remaining space of the direct contact hole DCH may be filled by the gap fill insulating layer P244 around the direct contact DC. The gap fill insulating layer P244 may include a silicon nitride layer. A thickness of the preliminary inner oxide layer P240 may be less than that of the gap fill insulating layer P244.

Figure 12B:
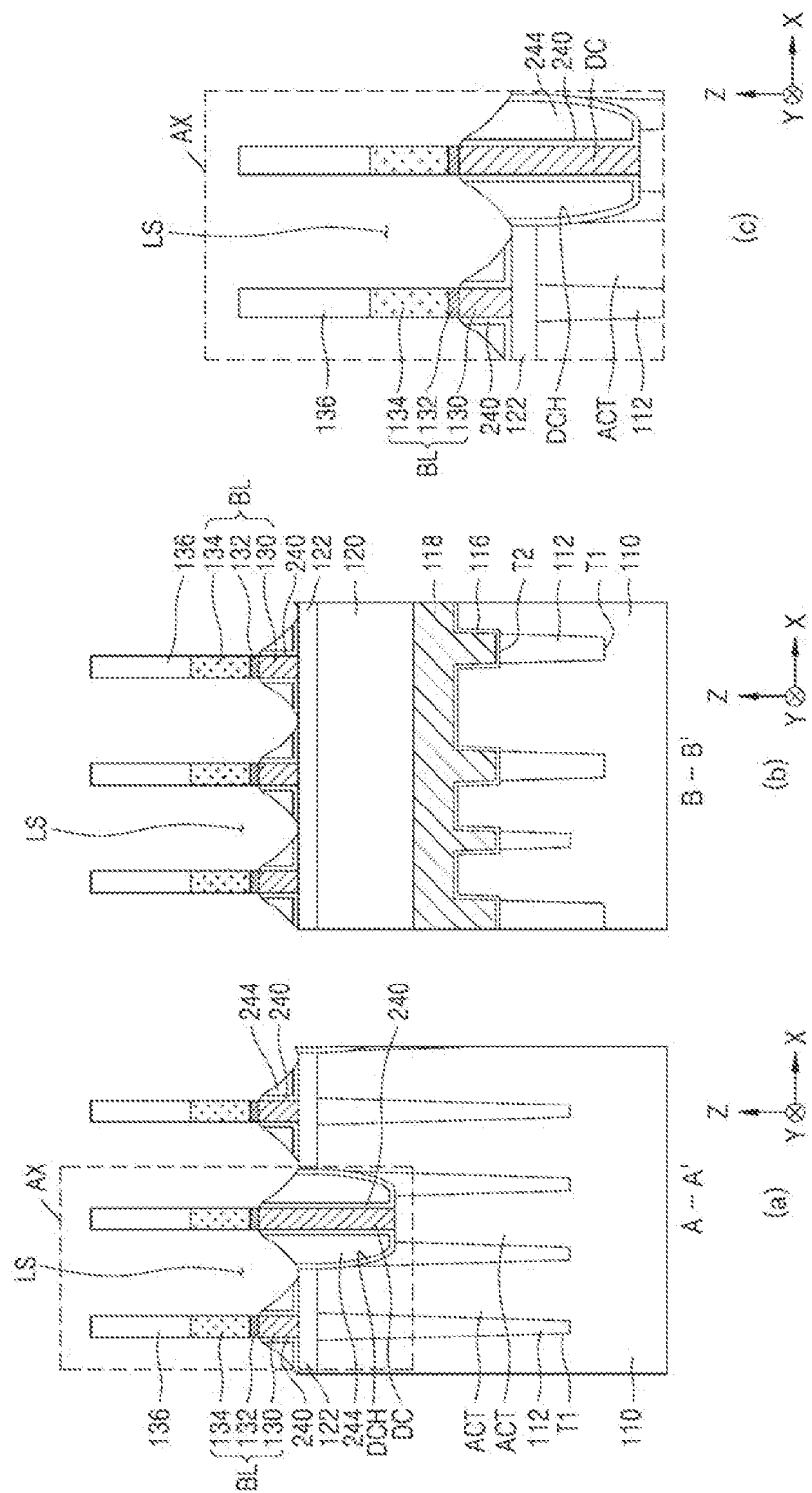

Referring to FIG. 12B, in a method similar to that described with respect to the method of forming the gap fill insulating pattern 144 with reference to FIG. 11J, the gap fill insulating pattern 244 including the remaining portion of the gap fill insulating layer P244 may be formed by isotropically etching the gap fill insulating layer P244.

While the gap fill insulating layer P244 is isotropically etched, the preliminary inner oxide layer P240 may function as an etch stop layer protecting the bit line BL and the insulating capping pattern 136. Portions of the preliminary inner oxide layer P240 that are not covered by the gap fill insulating pattern 244 may be removed, and portions of the preliminary inner oxide layer P240 that are covered by the gap fill insulating pattern 244 may remain as the inner oxide layer 240. The gap fill insulating pattern 244 may be apart from the direct contact DC with the inner oxide layer 240 therebetween. The inner oxide layer 240 and the gap fill insulating pattern 244 may cover both sidewalls of the lower conductive layer 130 of the bit line BL and both sidewalls of the direct contact DC.

Figure 12C:
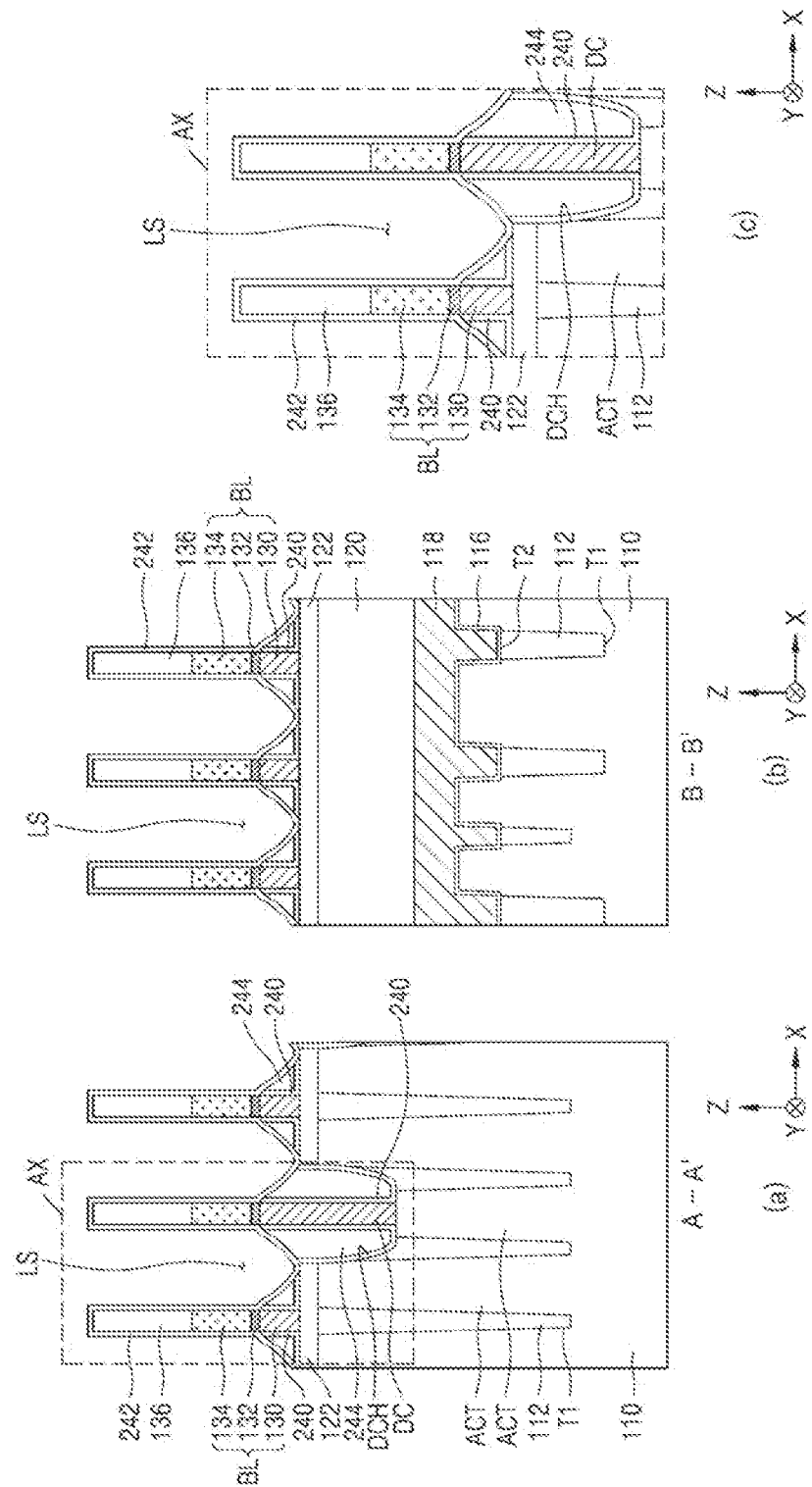

Referring to FIG. 12C, in a manner similar to that described for the method of forming the carbon-containing oxide layer 142 with reference to FIG. 11H, a carbon-containing oxide layer 242 conformally covering the exposed surfaces of the result illustrated in FIG. 12B is formed. The carbon-containing oxide layer 242 may contact the intermediate conductive layer 132, the upper conductive layer 134, and the insulating capping pattern 136.

According to an example embodiment, the carbon-containing oxide layer 2422 may substantially have a constant thickness in the vertical direction (Z direction) on the sidewall of the bit line BL and the sidewall of the insulating capping pattern 136. In other example embodiments, similar to the forming method of the carbon-containing oxide layer 142A illustrated in FIG. 3 with reference to FIG. 11H, the carbon-containing oxide layer 242A illustrated in FIG. 6 may be formed in the operation in FIG. 12C, instead of the carbon-containing oxide layer 242.

Referring to FIG. 12D, in the same manner as described for the method of forming the plurality of intermediate insulating spacers 146 with reference to FIG. 11K, the plurality intermediate insulating spacer 246 covering both sidewalls of each of the plurality of bit lines BL may be formed from the result illustrated in FIG. 12C. The plurality of intermediate insulating spacers 246 may be apart from the bit line BL and the insulating capping pattern 136 with the carbon-containing oxide layer 242 therebetween.

After the plurality of intermediate insulating spacers 246 are formed, by etching portions of the carbon-containing oxide layer 242 that are continuously exposed from the bottom portions of the plurality of line spaces LS, a portion of the inner oxide layer 240, a portion of the gap fill insulating pattern 244, and a portion of the buffer layer 122, a portion of the substrate 110 and a portion of the buried insulating layer 120 may be exposed through the plurality of line spaces LS.

Figure 12E:
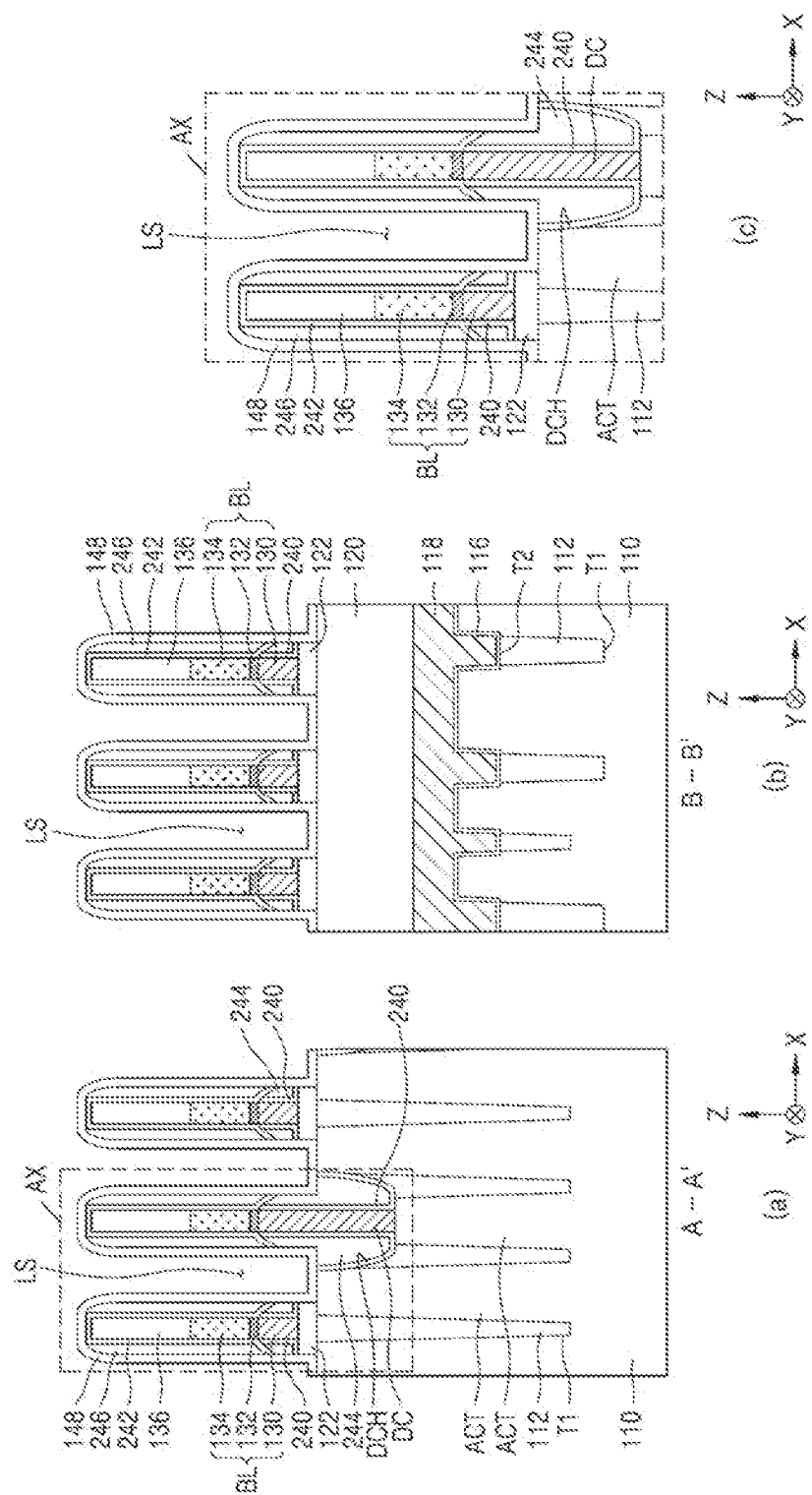

Referring to FIG. 12E, the outer insulating spacers 148 covering the plurality of intermediate insulating spacers 246 may formed in the same manner as the method described with reference to FIG. 11L in the result illustrated in FIG. 12D.

Referring to FIG. 12F, in the result illustrated in FIG. 12E, in the same manner as the method described with reference to FIG. 11M, the plurality of insulating fences 149 may be formed in the line space LS between each of the plurality of bit lines BL, the LS may be divided into the plurality of contact spaces CS, and then the plurality of recess spaces R1 communicating with the plurality of contact spaces CS may be formed.

A portion of the active region ACT of the substrate 110, a portion of the inner oxide layer 240, and a portion of the gap fill insulating pattern 144 may be exposed through the plurality of recess spaces R1. Because the carbon-containing oxide layer 242 is covered with the outer insulating spacer 148, the carbon-containing oxide layer 242 may not be exposed in the plurality of contact spaces CS and the plurality of recess spaces R1.

Figure 12G:
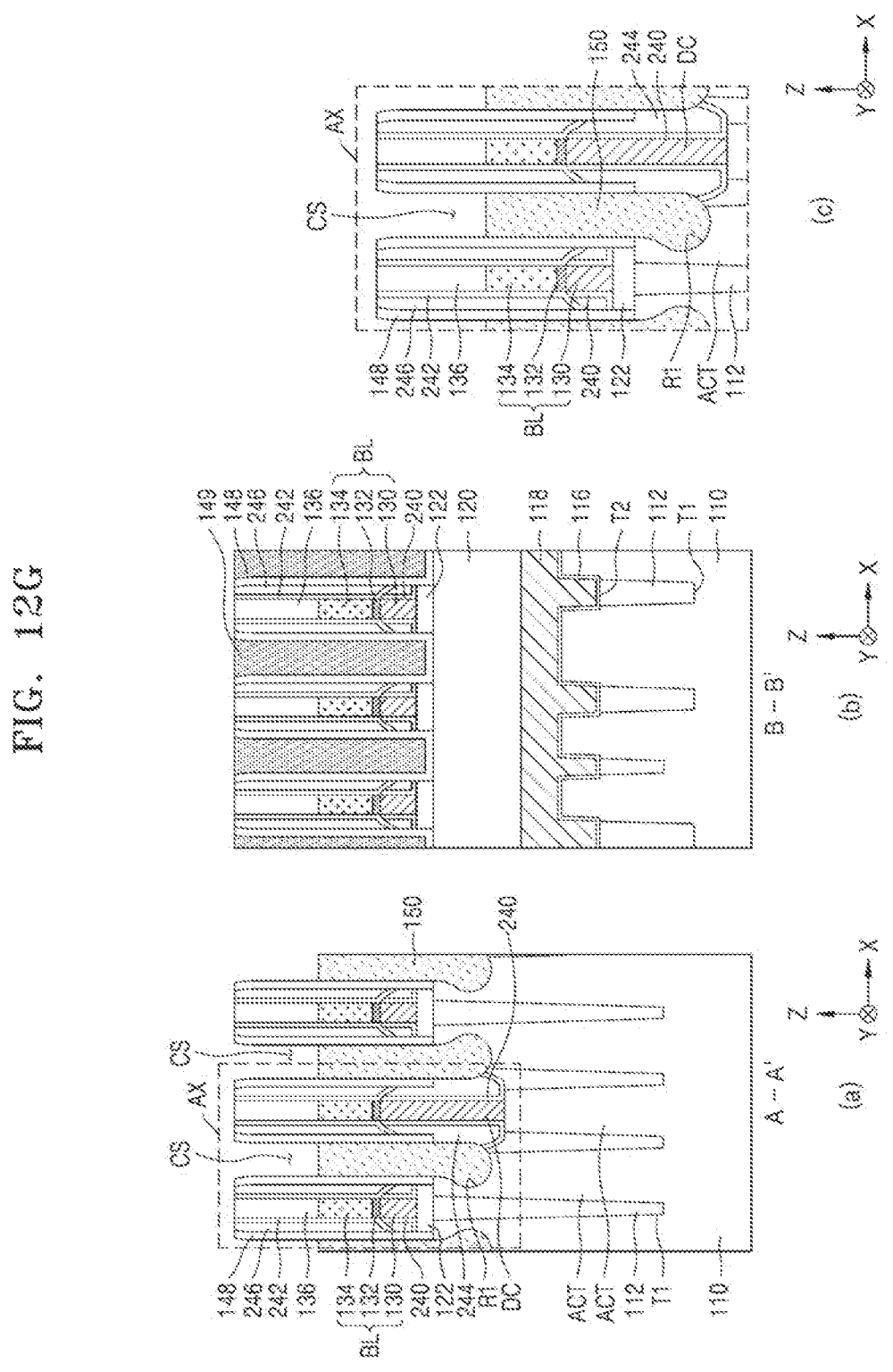

Referring to FIG. 12G, in the same manner as the method described with reference to FIG. 11N in the result illustrated in FIG. 12F, the plurality of contact plugs 150 may be formed between each of the plurality of bit lines BL.

Figure 12H:
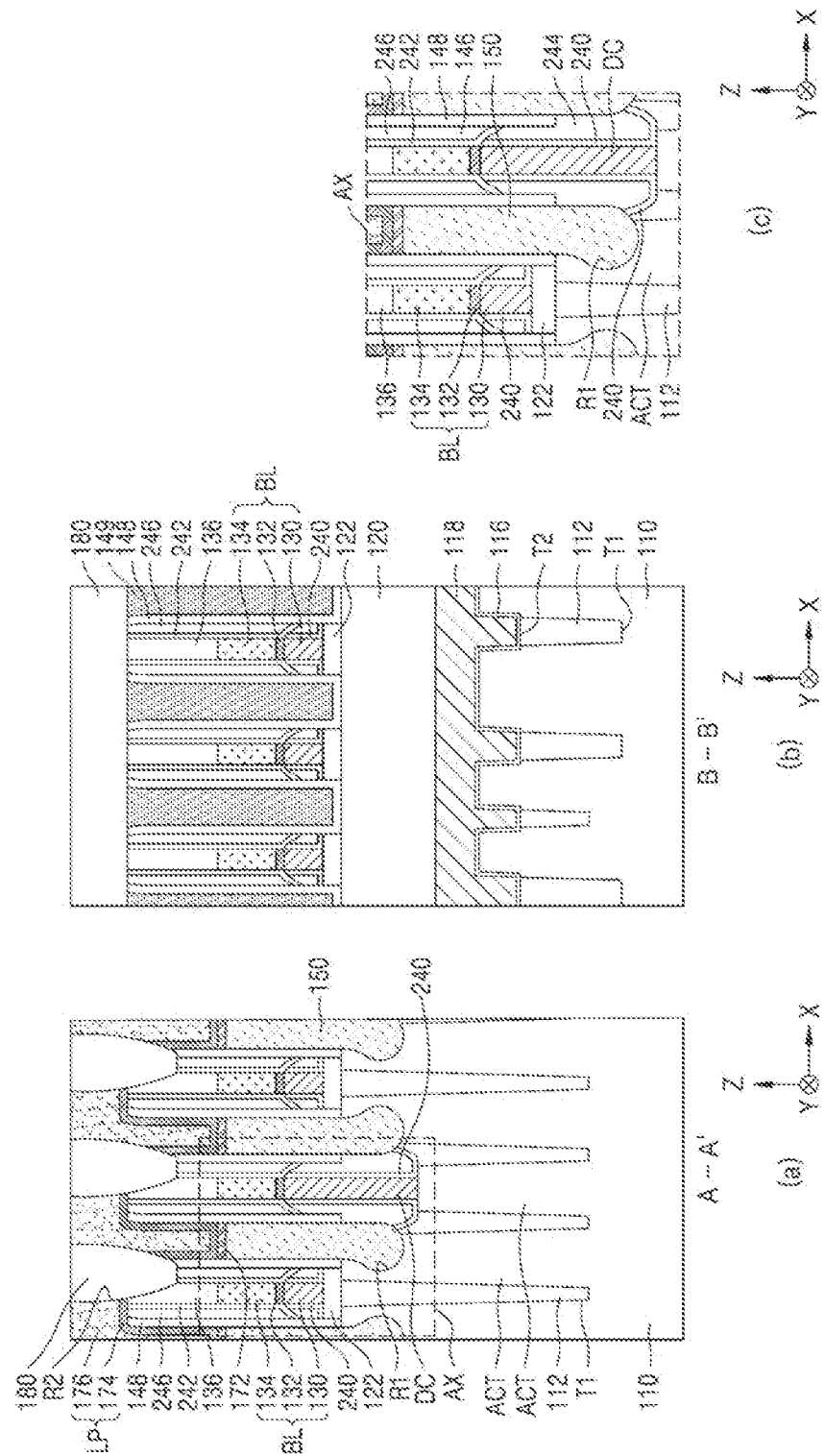

Referring to FIG. 12H, the plurality of metal silicide layers 172 and the plurality of conductive landing pads LP may be formed on the resultant product illustrated in FIG. 12G, and after the upper recess space R2 is formed around the plurality of conductive landing pads LP, the insulating layer 180 filling the upper recess space R2 may be formed and then the integrated circuit device 200 illustrated in FIGS. 5A-5C may be manufactured.

According to an example embodiment, after the upper recess space R2 around the plurality of conductive landing pads LP is formed in the process described with reference to FIG. 12H, and before the upper recess space R2 is filled with the insulating layer 180, at least a portion of the plurality of intermediate insulating spacers 146 may be removed through the upper recess space R2.

In an example, the silicon oxide layer constituting the plurality of intermediate insulating spacers 246 may be completely removed through the upper recess space R2 so that the intermediate insulating spacer 246 is formed as an air spacer.

In another example, to manufacture the integrated circuit device 200B illustrated in FIG. 7, after the upper recess space R2 is formed in the process described with reference to FIG. 12H, and before the upper recess space R2 is filled with the insulating layer 180, the air spacer AS2 may be formed by removing a portion of the silicon oxide layer constituting the plurality of intermediate insulating spacer 246 through the upper recess space R2, and the intermediate insulating spacer pattern P1 including a remaining portion of the intermediate insulating spacer 246 at the bottom portion of the air spacer AS2 may be maintained.

Figure 13A:
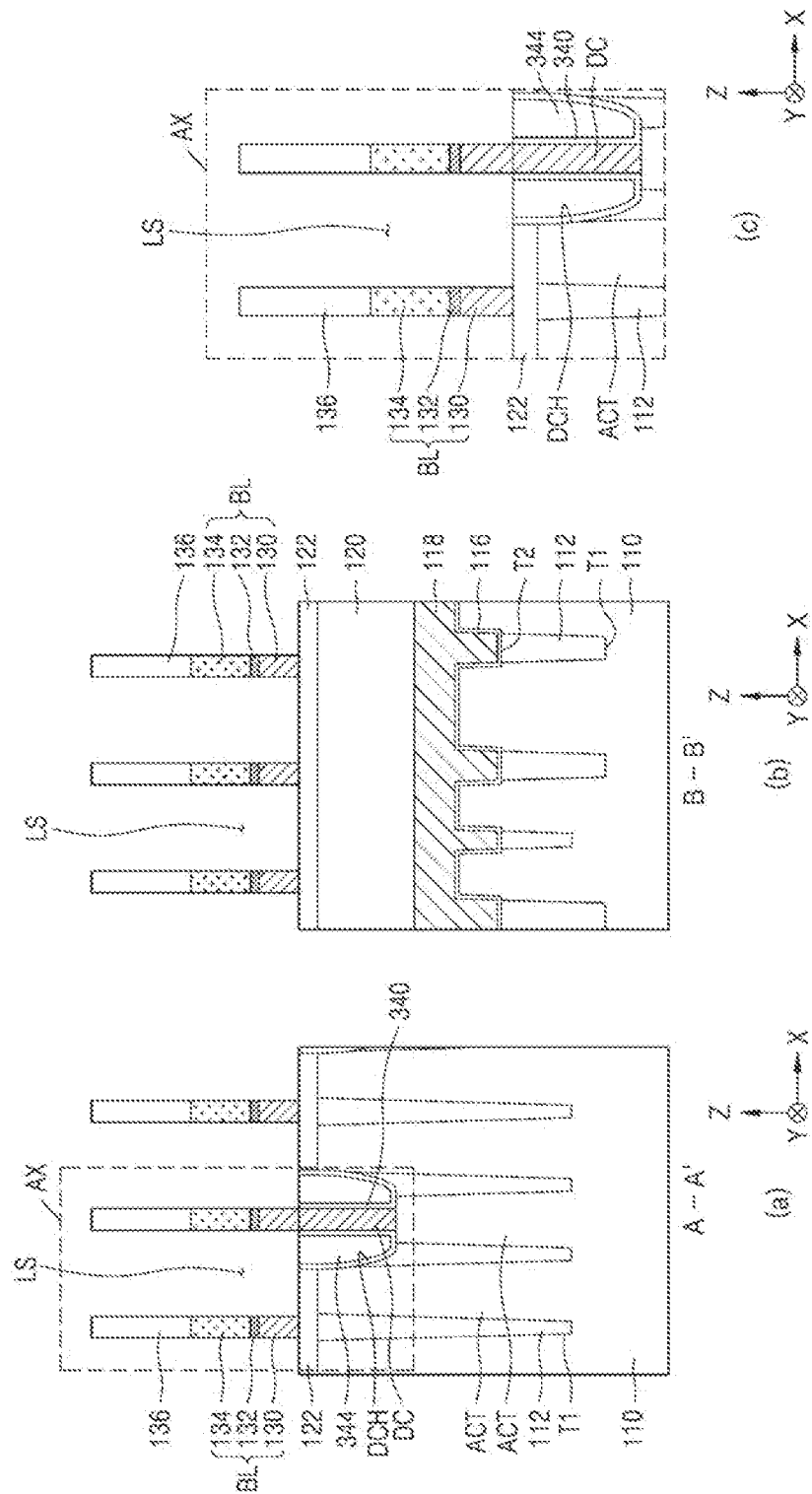
FIGS. 13A and 13B are cross-sectional views illustrating a manufacturing method of an integrated circuit device according to process sequences, according to another example embodiments of the inventive concept.
Figure 13B:
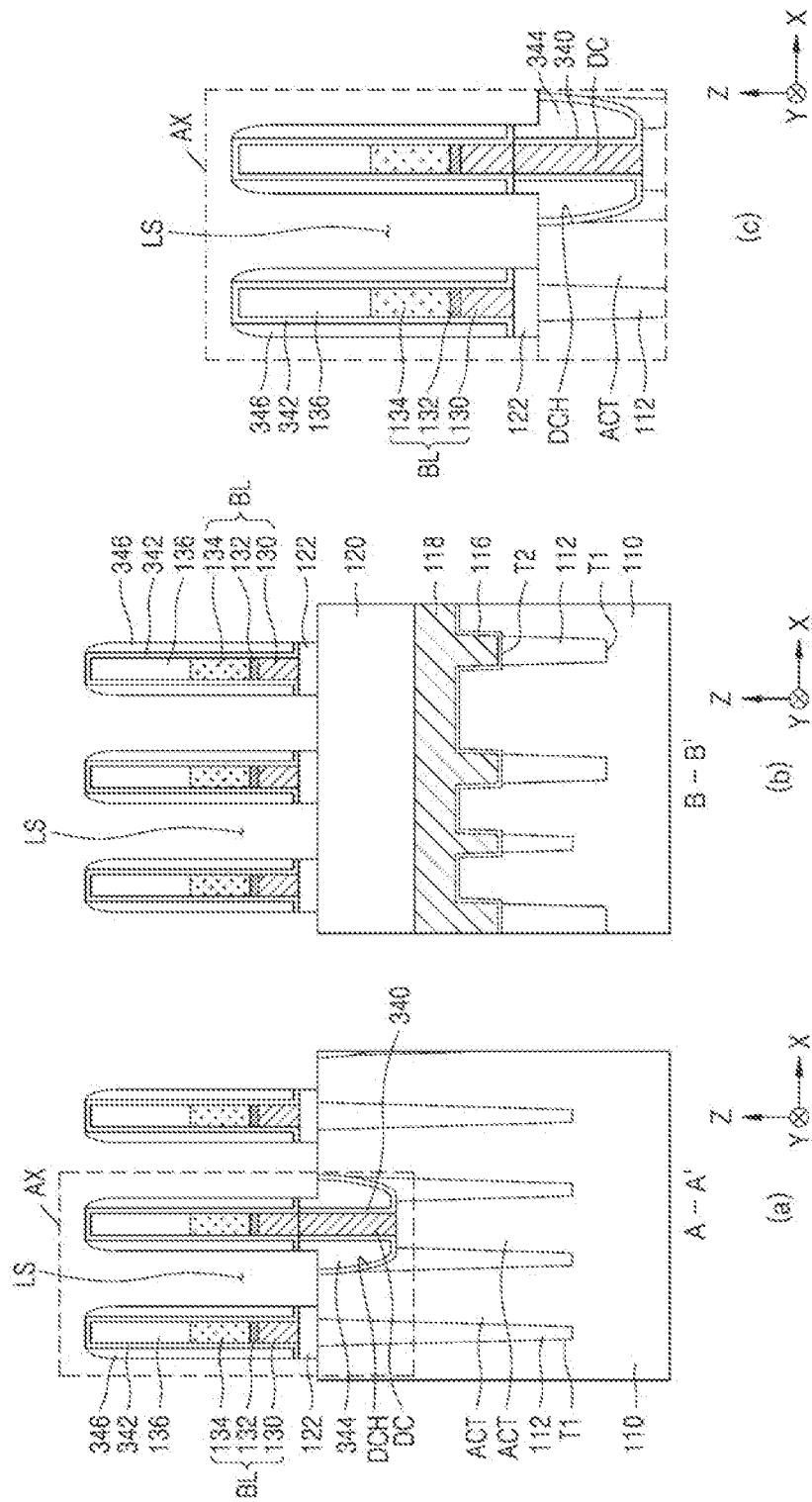

FIGS. 13A and 13B are cross-sectional views illustrating a method of manufacturing an integrated circuit device according to another example embodiment of the inventive concept. In FIGS. 13A and 13B, (a) is a cross-sectional view of some components according to a process sequence of a portion corresponding to a cross-section taken along line A-A' of FIG. 1, (b) is a cross-sectional view of some components according to a process sequence of a portion corresponding to a cross-section taken along line B-B' of FIG. 1, and (c) is an enlarged cross-sectional view of a portion corresponding to a dash-lined region AX in (a). An example manufacturing method of the integrated circuit device 300 illustrated in FIG. 8 are described with reference to FIGS. 13A and 13B. In FIGS. 13A and 13B, the same reference numerals as those in FIGS. 1 through 12H may denote the same members, and descriptions thereof are omitted here.

Referring to FIG. 13A, in a manner similar to the method of forming the inner oxide layer 240 and the gap fill insulating pattern 244 with reference to FIGS. 12A and 12B, the inner oxide layer 340 and the gap fill insulating pattern 344 may be formed. However, in FIGS. 13A and 13B, the inner oxide layer 340 and the gap fill insulating pattern 344 may be formed to cover both sidewalls of the direct contact DC at a level lower than the top surface of the buffer layer 122. The inner oxide layer 340 and the gap fill insulating pattern 344 may not cover both sidewalls of the direct contact DC at a level higher than the top surface of the buffer layer 122. Both sidewalls of the lower conductive layer 130 of each of the plurality of bit lines BL may not be covered with the inner oxide layer 340 and the gap fill insulating pattern 344. The inner oxide layer 340 may be between the direct contact DC and the gap fill insulating pattern 344. The gap fill insulating pattern 344 may be apart from the direct contact DC with the inner oxide layer 340 therebetween.

Referring to FIG. 13B, in the result illustrated in FIG. 13A, in the similar method to the forming method, described with reference to FIGS. 12C and 12D, of the carbon-containing oxide layer 242 and the intermediate insulating spacer 246, the carbon-containing oxide layer 342 and the intermediate insulating spacer 346 may be formed.

The carbon-containing oxide layer 342 may conformally cover the sidewall of the bit line BL, the sidewall of the insulating capping pattern 136, the sidewall of the direct contact DC, the top surface of the inner oxide layer 340, and the top surface of the gap fill insulating pattern 344. The carbon-containing oxide layer 342 may contact the lower conductive layer 130, the intermediate conductive layer 132, and the upper conductive layer 134 of the bit line BL, and the plurality of insulating capping patterns 136. A more detailed configuration of the carbon-containing oxide layer 342 may be substantially the same as that described for the carbon-containing oxide layer 142 with reference to FIGS. 2 and 11H.

According to an example embodiment, the carbon-containing oxide layer 342 may substantially have a constant thickness in the vertical direction (Z direction) on the sidewall of the bit line BL and the sidewall of the insulating capping pattern 136. In other example embodiments, similar to the forming method of the carbon-containing oxide layer 142A illustrated in FIG. 3 with reference to FIG. 11H, the carbon-containing oxide layer 342A illustrated in FIG. 9 may be formed in the operation in FIG. 13B, instead of the carbon-containing oxide layer 342. Next, by performing processes similar to those described with reference to FIGS. 12E through 12H, the integrated circuit device 300 illustrated in FIG. 8 may be manufactured.

To manufacture the integrated circuit device 300B illustrated in FIG. 10, in the process described with reference to FIG. 12H, the air spacer AS3 may be formed by removing a portion of the silicon oxide layer constituting the plurality of intermediate insulating spacers 146B through the upper recess space R2, and the intermediate insulating spacer pattern P3 including the remaining portion of the silicon oxide layer may remain under the air spacer AS3.

While the inventive concept has been particularly shown and described with reference to example embodiments thereof, it will be understood that various changes in form and details may be made therein without departing from the spirit and scope of the following claims.

What is claimed is:

1. An integrated circuit device, comprising:
    a substrate comprising a plurality of active regions;
    a device isolation layer on the substrate, the device isolation layer defining the plurality of active regions;
    a plurality of bit lines spaced apart from each other on the substrate in a first direction, the plurality of bit lines extending in a second direction crossing the first direction, each of the plurality of bit lines comprising a metal layer, an uppermost surface of the metal layer of each of the plurality of bit lines being on a first level of a first line extending in the first line on the plurality of active regions and on the device isolation layer;

a direct contact provided between a first active region among the plurality of active regions and a first bit line among the plurality of bit lines;
an inner oxide layer contacting a sidewall of the direct contact; and
a carbon-containing oxide layer contacting a sidewall of the first bit line, the carbon-containing oxide layer being separate from the inner oxide layer.

2. The integrated circuit device of claim 1, wherein a lowermost surface of the metal layer of each of the plurality of bit lines is on a second level of a second line extending in the first line on the plurality of active regions and on the device isolation layer.

3. The integrated circuit device of claim 1, further comprising:
a plurality of contact plugs arranged in a line along the first direction, each of the plurality of contact plugs being provided one by one between two adjacent bit lines among the plurality of bit lines; and
a plurality of conductive landing pads on the plurality of contact plugs and connected to the plurality of contact plugs,
wherein an uppermost surface of each of the plurality of conductive landing pads is on a third level of a third line extending in the first line.

4. The integrated circuit device of claim 1, further comprising a plurality of insulating capping patterns covering the plurality of bit lines,
wherein a first height of each of the plurality of insulating capping patterns is greater than a second height of the metal layer of each of the plurality of bit lines.

5. The integrated circuit device of claim 1, further comprising a plurality of insulating capping patterns covering the plurality of bit lines,
wherein a bottom of each of the plurality of insulating capping patterns contacts the uppermost surface of the metal layer.

6. The integrated circuit device of claim 1, further comprising a buffer layer provided between the substrate and the metal layer, the buffer layer vertically overlapping the metal layer,
wherein the buffer layer includes a silicon nitride layer.

7. The integrated circuit device of claim 1, further comprising:
a contact plug connected to a second active region adjacent to the first active region among the plurality of active regions, and
a gap fill insulating pattern provided between a lower portion of the contact plug and the direct contact,
wherein the inner oxide layer is spaced apart from the contact plug with the gap fill insulating pattern therebetween.

8. The integrated circuit device of claim 1, further comprising:
a contact plug connected to a second active region adjacent to the first active region among the plurality of active regions, and
a gap fill insulating pattern provided between a lower portion of the contact plug and the direct contact,
wherein the carbon-containing oxide layer comprises a portion provided between the direct contact and the gap fill insulating pattern.

9. The integrated circuit device of claim 1, wherein the carbon-containing oxide layer includes an SiOC layer.

10. The integrated circuit device of claim 1, further comprising:

a contact plug connected to a second active region adjacent to the first active region among the plurality of active regions,
a gap fill insulating pattern provided between a lower portion of the contact plug and the direct contact, and
an outer insulating spacer covering the sidewall of the first bit line on the gap fill insulating pattern,
wherein at least one of the gap fill insulating pattern and the outer insulating spacer includes a silicon nitride layer.

11. The integrated circuit device of claim 1, wherein the metal layer of each of the plurality of bit lines includes tungsten.

12. An integrated circuit device, comprising:
a substrate comprising a plurality of active regions;
a first bit line and a second bit line spaced apart from each other on the substrate in a first direction, each of the first bit line and the second bit line extending in a second direction crossing the first direction, each of the first bit line and the second bit line comprising a metal layer;
a direct contact provided between a first active region among the plurality of active regions and the first bit line;
an inner oxide layer contacting a sidewall of the direct contact; and
a carbon-containing oxide layer contacting a sidewall of the first bit line, the carbon-containing oxide layer being separate from the inner oxide layer,
wherein an uppermost surface of the metal layer of each of the first bit line and the second bit line is on a first level of a first line, and
wherein a lowermost surface of the metal layer of each of the first bit line and the second bit line is on a second level of a second line parallel to the first line.

13. The integrated circuit device of claim 12, further comprising:
a plurality of contact plugs arranged in a line along the first direction; and
a plurality of conductive landing pads on the plurality of contact plugs and connected to the plurality of contact plugs,
wherein a first contact plug among the plurality of contact plugs is provided between the first bit line and the second bit line, and the first contact plug is connected to a second active region adjacent to the first active region among the plurality of active regions, and
wherein an uppermost surface of each of the plurality of conductive landing pads is on a third level of a third line extending in the first line.

14. The integrated circuit device of claim 12, further comprising:
a first insulating capping pattern provided on the first bit line in a vertical direction; and
a second insulating capping pattern provided on the second bit line in the vertical direction,
wherein a first height of each of the first and second insulating capping patterns is greater than a second height of the metal layer of each of the first and second bit lines in the vertical direction.

15. The integrated circuit device of claim 12, further comprising:
a first buffer layer provided between the substrate and the metal layer of the first bit line in a vertical direction; and a second buffer layer provided between the substrate and the metal layer of the second bit line in the vertical direction, wherein each of the first and second buffer layers includes a silicon nitride layer.

16. The integrated circuit device of claim 12, further comprising:
a contact plug connected to a second active region adjacent to the first active region among the plurality of active regions, the contact plug being provided between the first bit line and the second bit line;
a gap fill insulating pattern provided between a lower portion of the contact plug and the direct contact;
a first outer insulating spacer provided between the first bit line and the contact plug; and
a second outer insulating spacer provided between the second bit line and the contact plug,
wherein each of the gap fill insulating pattern, the first outer insulating spacer, and the second outer insulating spacer includes a silicon nitride layer.

17. An integrated circuit device, comprising:
a substrate comprising a plurality of active regions;
a device isolation layer on the substrate, the device isolation layer defining the plurality of active regions;
a plurality of bit lines spaced apart from each other on the substrate in a first direction, the plurality of bit lines extending in a second direction crossing the first direction, each of the plurality of bit lines comprising a metal layer;
a direct contact provided between a first active region among the plurality of active regions and a first bit line among the plurality of bit lines;
a plurality of contact plugs arranged in a line along the first direction, each of the plurality of contact plugs being provided one by one between two adjacent bit lines among the plurality of bit lines and extending on the substrate in a vertical direction perpendicular to the first and second directions, a first contact plug among the plurality of contact plugs being connected to a second active region adjacent to the first active region among the plurality of active regions; and
a spacer structure provided between the first bit line and the first contact plug, the spacer structure comprising an inner oxide layer contacting a sidewall of the direct contact, and a carbon-containing oxide layer contacting a sidewall of the metal layer of the first bit line, the carbon-containing oxide layer being separate from the inner oxide layer, wherein an uppermost surface of the metal layer of each of the plurality of bit lines is on a first level of a first line, and wherein a lowermost surface of the metal layer of each of the plurality of bit lines is on a second level of a second line parallel to the first line.

18. The integrated circuit device of claim 17, further comprising a plurality of conductive landing pads on the plurality of contact plugs and connected to the plurality of contact plugs,
wherein an uppermost surface of each of the plurality of conductive landing pads is on a third level of a third line extending in the first line.

19. The integrated circuit device of claim 17, further comprising:
a plurality of insulating capping patterns each vertically overlapping the metal layer of each of the plurality of bit lines; and
a plurality of buffer layers each provided between the substrate and the metal layer of each the plurality of bit lines, each of the plurality of buffer layers vertically overlapping the metal layer of each of the plurality of bit lines,
wherein a first height of each of the plurality of insulating capping patterns is greater than a second height of the metal layer of each of the plurality of bit lines.

20. The integrated circuit device of claim 17, wherein the metal layer of each of the plurality of bit lines includes tungsten,
wherein the carbon-containing oxide layer includes an SiOC layer, and
wherein the spacer structure further comprises an outer insulating spacer covering the sidewall of the metal layer, the outer insulating spacer including a silicon nitride layer.

* * * * *